(12) United States Patent
Chen et al.

(10) Patent No.: US 11,398,259 B2
(45) Date of Patent: Jul. 26, 2022

(54) MEMORY CELL ARRAY OF MULTI-TIME PROGRAMMABLE NON-VOLATILE MEMORY

(71) Applicant: eMemory Technology Inc., Hsin-Chu (TW)

(72) Inventors: Chih-Hsin Chen, Hsinchu County (TW); Chun-Yuan Lo, Hsinchu County (TW); Shih-Chen Wang, Hsinchu County (TW); Tsung-Mu Lai, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/183,528

(22) Filed: Feb. 24, 2021

(65) Prior Publication Data

US 2021/0287746 A1  Sep. 16, 2021

Related U.S. Application Data

(60) Provisional application No. 62/988,403, filed on Mar. 12, 2020.

(51) Int. Cl.
| | |
|---|---|
| *G11C 16/04* | (2006.01) |
| *G11C 7/08* | (2006.01) |
| *G11C 11/16* | (2006.01) |
| *G11C 13/00* | (2006.01) |
| *G11C 16/10* | (2006.01) |
| *G11C 16/14* | (2006.01) |
| *G11C 16/26* | (2006.01) |

(52) U.S. Cl.
CPC ............ *G11C 7/08* (2013.01); *G11C 11/1659* (2013.01); *G11C 11/1673* (2013.01); *G11C 13/003* (2013.01); *G11C 13/004* (2013.01); *G11C 16/0416* (2013.01); *G11C 16/10* (2013.01); *G11C 16/14* (2013.01); *G11C 16/26* (2013.01); *G11C 2013/0042* (2013.01); *G11C 2013/0045* (2013.01); *G11C 2207/063* (2013.01)

(58) Field of Classification Search
CPC . H01L 27/0207; H01L 27/11519; G11C 7/08; G11C 11/1659; G11C 11/1673; G11C 13/003; G11C 13/004; G11C 16/0416; G11C 16/10; G11C 16/14; G11C 16/26; G11C 2013/0042; G11C 2013/0045; G11C 2207/063; G11C 5/025; G11C 16/0433; G11C 2216/10
See application file for complete search history.

(56) References Cited

U.S. PATENT DOCUMENTS 8,787,092 B2 *  7/2014  Chen ................ G11C 16/10
                                                365/185.01
8,958,245 B2    2/2015  Hsu et al.
(Continued)

*Primary Examiner* — Khamdan N. Alrobaie
(74) *Attorney, Agent, or Firm* — WPAT, PC

(57) ABSTRACT

A memory cell array of a multi-time programmable non-volatile memory includes plural memory cells. The memory cell has the structure of 1T1C cell, 2T1C cell or 3T1C cell. Moreover, the floating gate transistors of the memory cells in different rows of the memory cell array are constructed in the same well region. Consequently, the chip size is reduced. Moreover, by providing proper bias voltages to the memory cell array, the program action, the erase action or the read action can be performed normally.

9 Claims, 9 Drawing Sheets

(56) References Cited

U.S. PATENT DOCUMENTS

| | | | |
|---|---|---|---|
| 2006/0209597 A1* | 9/2006 | Wang | G11C 16/24 365/185.25 |
| 2008/0225601 A1* | 9/2008 | Ratnakumar | G11C 16/0441 257/E27.103 |
| 2009/0201742 A1* | 8/2009 | Lee | G11C 16/0441 257/E29.345 |
| 2011/0310669 A1* | 12/2011 | Ching | H01L 29/7881 365/185.15 |
| 2012/0236646 A1* | 9/2012 | Hsu | H01L 29/7881 257/316 |
| 2015/0091074 A1* | 4/2015 | Hsu | H01L 29/4916 257/316 |
| 2015/0092498 A1* | 4/2015 | Ching | G11C 16/14 365/185.23 |
| 2015/0287438 A1* | 10/2015 | Chen | H01L 23/528 365/185.05 |
| 2016/0379688 A1* | 12/2016 | Chen | H01L 29/42368 365/185.05 |
| 2017/0206970 A1* | 7/2017 | Lai | H01L 27/11558 |
| 2017/0207230 A1* | 7/2017 | Sun | G11C 16/30 |
| 2019/0164981 A1* | 5/2019 | Chen | H01L 29/42328 |
| 2020/0006508 A1* | 1/2020 | Lo | G11C 16/0416 |
| 2020/0194079 A1* | 6/2020 | Chen | G11C 14/0018 |
| 2021/0280591 A1* | 9/2021 | Chen | G11C 16/14 |
| 2021/0287746 A1* | 9/2021 | Chen | G11C 16/26 |

\* cited by examiner

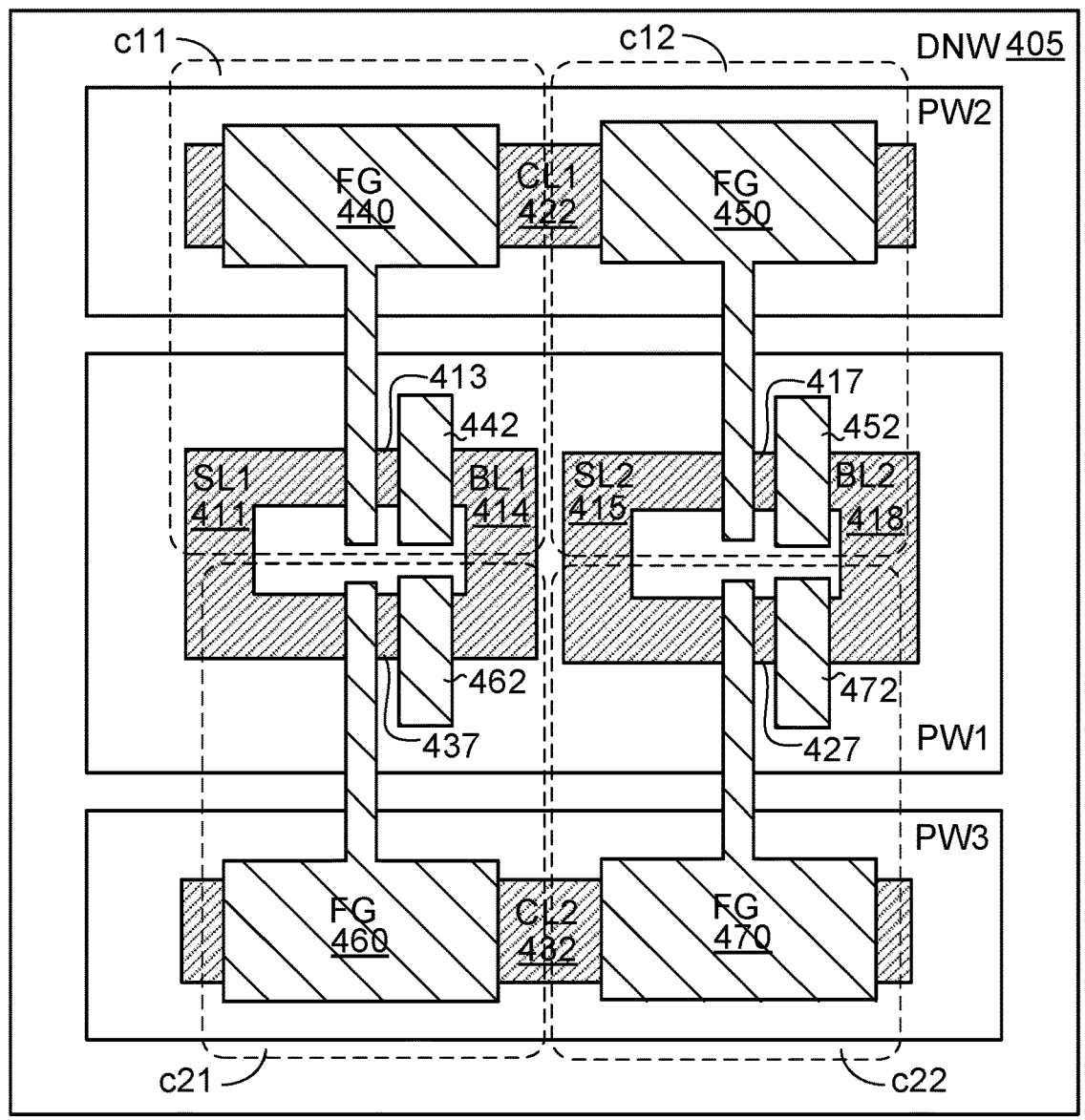
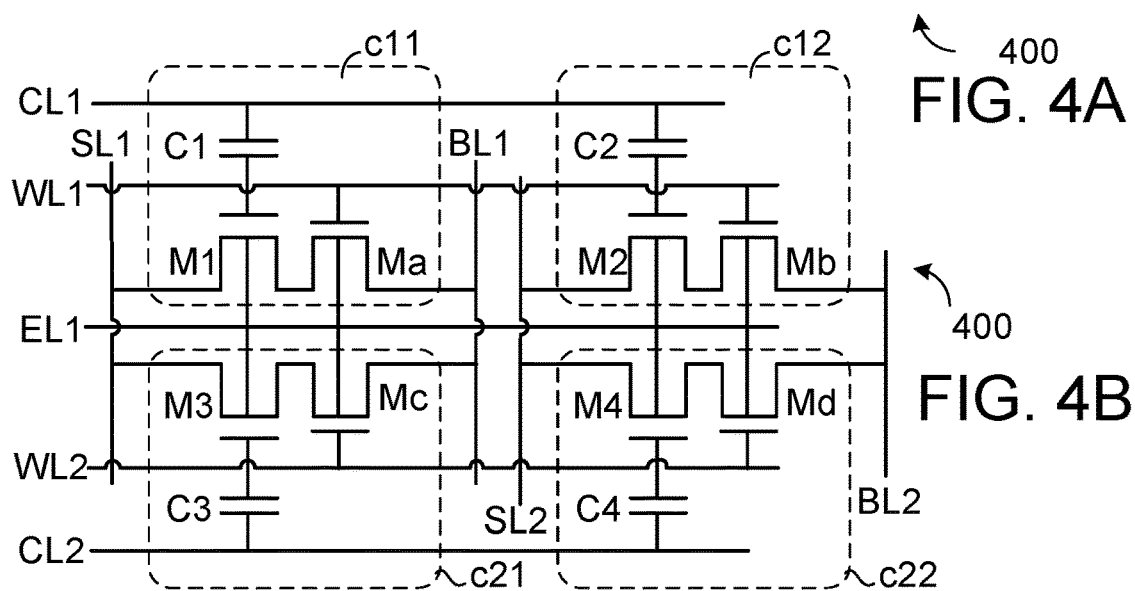
FIG. 4A
FIG. 4B

MEMORY CELL ARRAY OF MULTI-TIME PROGRAMMABLE NON-VOLATILE MEMORY

This application claims the benefit of U.S. provisional application Ser. No. 62/988,403, filed Mar. 12, 2020, the subject matter of which is incorporated herein by reference.

FIELD OF THE INVENTION

The present invention relates to a memory cell array of a non-volatile memory, and more particularly to a memory cell array of a multi-time programmable (MTP) non-volatile memory.

BACKGROUND OF THE INVENTION

As is well known, a non-volatile memory is able to continuously retain data after the supplied power is interrupted. After the non-volatile memory leaves the factory, the user may program the non-volatile memory in order to record data into the non-volatile memory.

Generally, the memory cell with a floating gate transistor may be served as an MTP memory cell. Moreover, plural MTP memory cell may be combined as a memory cell array of the MTP non-volatile memory.

FIG. 1 is a schematic circuit diagram illustrating a memory cell array of a conventional MTP non-volatile memory. As shown in FIG. 1, the memory cell array 100 comprises a plural memory cells c11~cmn, which are arranged in an m×n array. The memory cell array 100 is connected with m word lines WL1~WLm, n bit lines BL1~BLn and m control lines CL1~CLm. Moreover, each of the memory cells c11~cmn comprises a floating gate transistor. The floating gate transistor is a dual gate floating gate transistor, and comprises a floating gate, a control gate terminal, a first drain/source terminal, a second drain/source terminal and a body terminal.

In the n memory cells c11~c1n of the first row, the control gate terminals of the floating gate transistors are connected with the word line WL1, the first drain/source terminals of the floating gate transistors are connected with the control line CL1, the body terminals of the floating gate transistors are connected with a P-type well region pw1, and the second drain/source terminals of the floating gate transistors are respectively connected with the corresponding n bit lines BL1~BLn. In the n memory cells c21~c2n of the second row, the control gate terminals of the floating gate transistors are connected with the word line WL2, the first drain/source terminals of the floating gate transistors are connected with the control line CL2, the body terminals of the floating gate transistors are connected with a P-type well region pw2, and the second drain/source terminals of the floating gate transistors are respectively connected with the corresponding n bit lines BL1~BLn. The rest may be deduced by analog. In the n memory cells cm1~cmn of the m-th row, the control gate terminals of the floating gate transistors are connected with the word line WLm, the first drain/source terminals of the floating gate transistors are connected with the control line CLm, the body terminals of the floating gate transistors are connected with a P-type well region pwm, and the second drain/source terminals of the floating gate transistors are respectively connected with the corresponding n bit lines BL1~BLn.

By providing proper bias voltages to the word lines WL1~WLm, the bit lines BL1~BLn, the control lines CL1~CLm and the P-type well regions, the memory cells c11~cmn in the memory cell array 100 are subjected to program action, erase actions or read actions. For example, by providing an activated voltage to the word line WL1 and providing an inactivated voltage to the other word lines WL2~WLm, the first row connected to the word line WL1 is the selected row. Consequently, the n memory cells c11~c1n in the selected row are subjected to program action, erase actions or read actions.

In the memory cell array 100 of FIG. 1, the floating gate transistors are N-type dual gate floating gate transistors. It is noted that the types of the floating gate transistors are not restricted. For example, the memory cells with P-type dual gate floating gate transistors or single-gate floating gate transistors may be formed as the memory cell array of the MTP non-volatile memory.

Generally, the n memory cells of the memory cell array 100 connected to a word line are collaboratively formed as one page. For example, n=128. Whenever the erase action of the memory cell array 100 is performed, the data of the corresponding page are erased. That is, during the erase action, the stored data in the 128 memory cells of the selected row (i.e., the selected page) are all erased.

For erasing the n memory cells of the selected row at a time, the floating gate transistors in each row of the memory cell array 100 are constructed in the same well region. Take the memory cell array 100 of FIG. 1 for example. The floating gate transistors of the n memory cells c11~c1n in the first row are constructed in the P-type well region pw1. The floating gate transistors of the n memory cells c21~c2n in the second row are constructed in the P-type well region pw2. The rest may be deduced by analog. The floating gate transistors of the n memory cells cm1~cmn in the m-th row are constructed in the P-type well region pwm. In other words, the P-type well regions pw1~pwm are independent isolation regions. Moreover, different P-type well regions are separated from each other.

By providing a proper bias voltage to the P-type well region pw1 corresponding to the selected row, the stored data in the n memory cells c11~c1n in the selected row of the memory cell array 100 are erased. Since the other P-type well regions pw2~pwm are separated from the P-type well region pw1, the stored data in the memory cells c21~cmn in other rows of the memory cell array 100 are not erased.

Generally, the independent isolation regions may be constructed in a semiconductor substrate through an isolation process of a semiconductor manufacturing process. During the isolation process, it is necessary to follow the process rule to prevent from contacting between the isolation regions. However, since the memory cell array 100 has so many isolation regions, the chip size is large.

SUMMARY OF THE INVENTION

The present invention provides a memory cell array of a multi-time programmable non-volatile memory. The memory cell array comprises plural memory cells. The floating gate transistors of the memory cells in different rows of the memory cell array are constructed in the same well region. Since the number of isolation regions is reduced, the chip size is reduced. Moreover, by providing proper bias voltages to the memory cell array, the program action, the erase action or the read action can be performed normally.

An embodiment of the present invention provides a memory cell array of a multi-time programmable non-volatile memory. The memory cell array is connected with a first coupling line, a second coupling line, a first erase line, a first source line, a second source line, a first bit line and a second bit line. The memory cell array includes a first memory cell, a second memory cell, a third memory cell and a fourth memory cell. The first memory cell is connected with the first coupling line, the first erase line, the first source line and the first bit line. The second memory cell is connected with the first coupling line, the first erase line, the second source line and the second bit line. The third memory cell is connected with the second coupling line, the first erase line, the first source line and the first bit line. The fourth memory cell is connected with the second coupling line, the first erase line, the second source line and the second bit line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4A is a schematic view illustrating a process of manufacturing a memory cell array of a multi-time programmable memory according to a second embodiment of the present invention;

FIG. 4B is a schematic equivalent circuit diagram illustrating the memory cell array according to the second embodiment of the present invention;

DETAILED DESCRIPTION OF PREFERRED EMBODIMENTS

The present invention provides a non-volatile memory cell. The non-volatile memory cell comprises at least one single-gate floating gate transistor and a capacitor. In case that the non-volatile memory cell comprises one floating gate transistor and one capacitor, the non-volatile memory cell is referred as a 1T1C cell. In case that the non-volatile memory cell comprises one floating gate transistor, one select gate transistor and one capacitor, the non-volatile memory cell is referred as a 2T1C cell. In case that the non-volatile memory cell comprises one floating gate transistor, one switching transistor, one select gate transistor and one capacitor, the non-volatile memory cell is referred as a 3T1C cell. Moreover, the memory cells in different rows of a memory cell array are constructed in the same well region. Consequently, the number of isolation regions is reduced, and the chip size is reduced. Moreover, by providing proper bias voltages to the memory cell array, the program action, the erase action or the read action can be performed normally.

Figure 1:
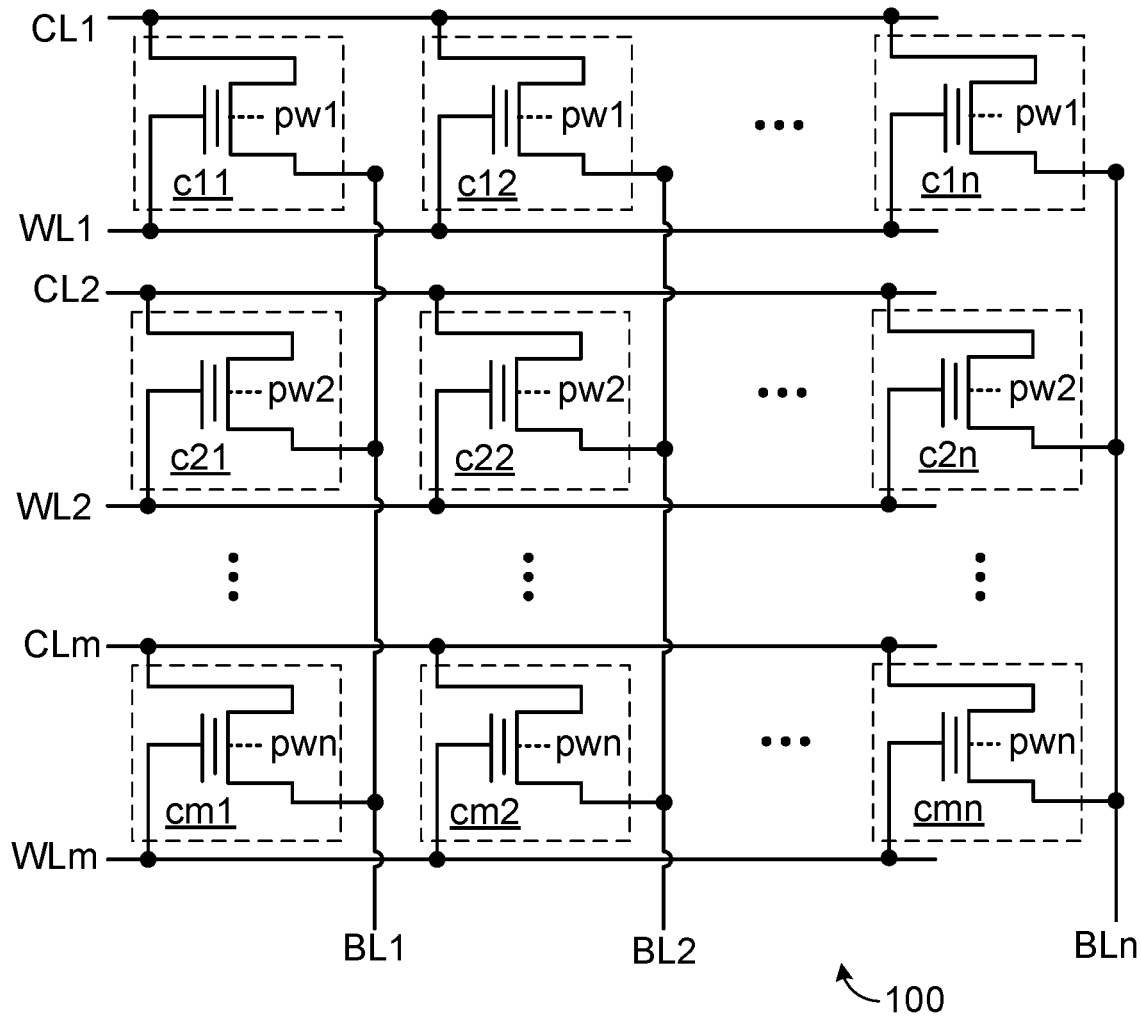
FIG. 1 (prior art) is a schematic circuit diagram illustrating a memory cell array of a conventional MTP non-volatile memory.
Figure 2A:
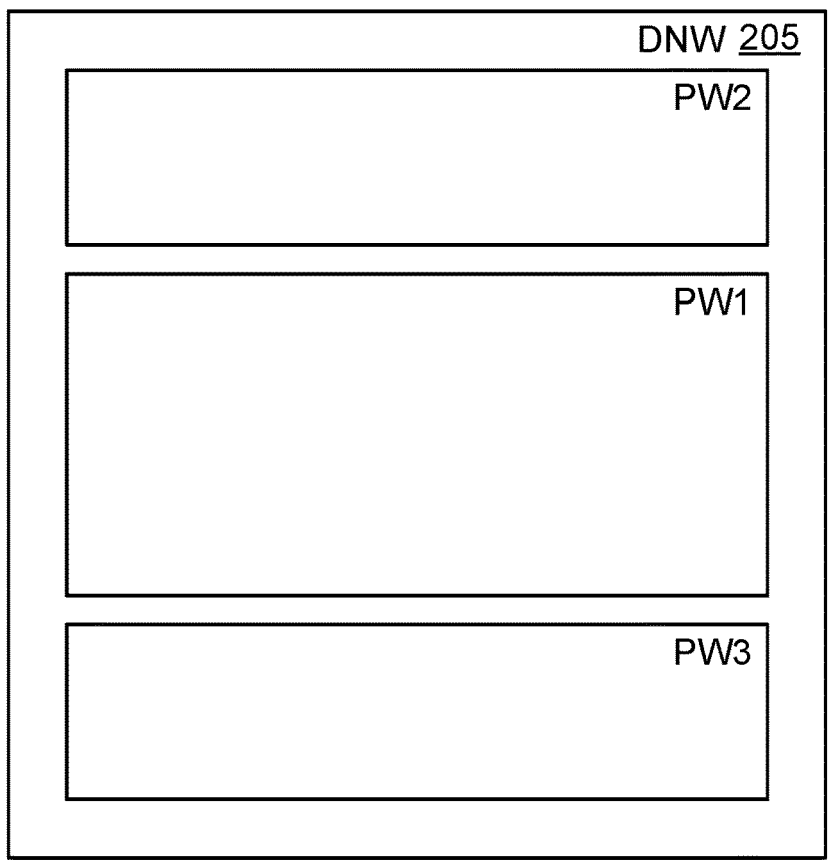
FIGS. 2A, 2B and 2C are schematic views illustrating a process of manufacturing a memory cell array of a multi-time programmable memory according to a first embodiment of the present invention.
Figure 2B:
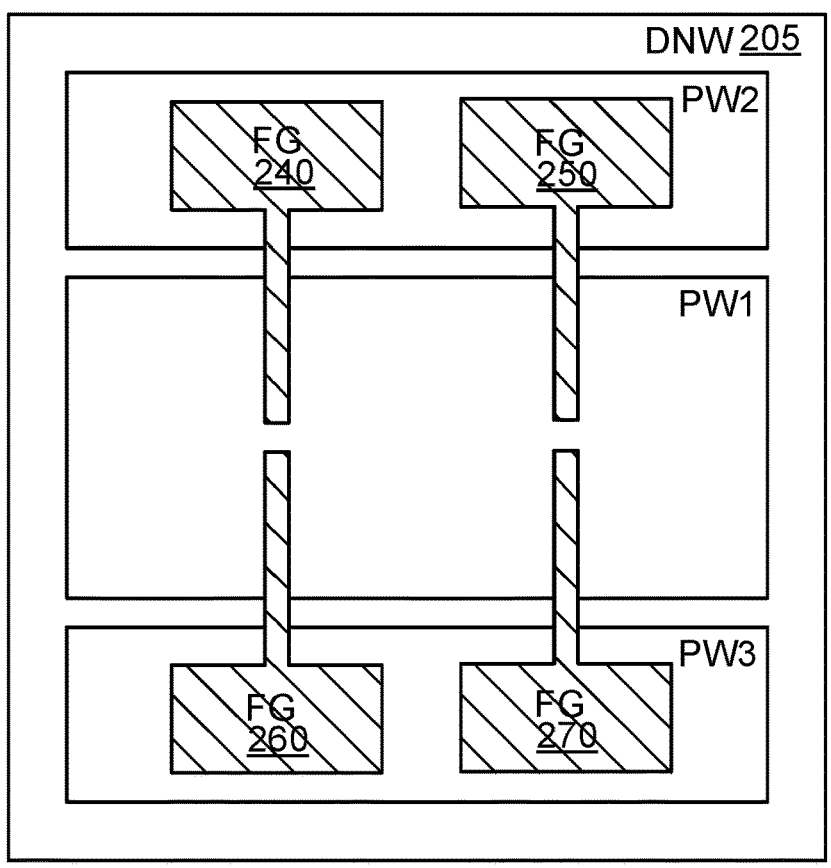
Figure 2C:
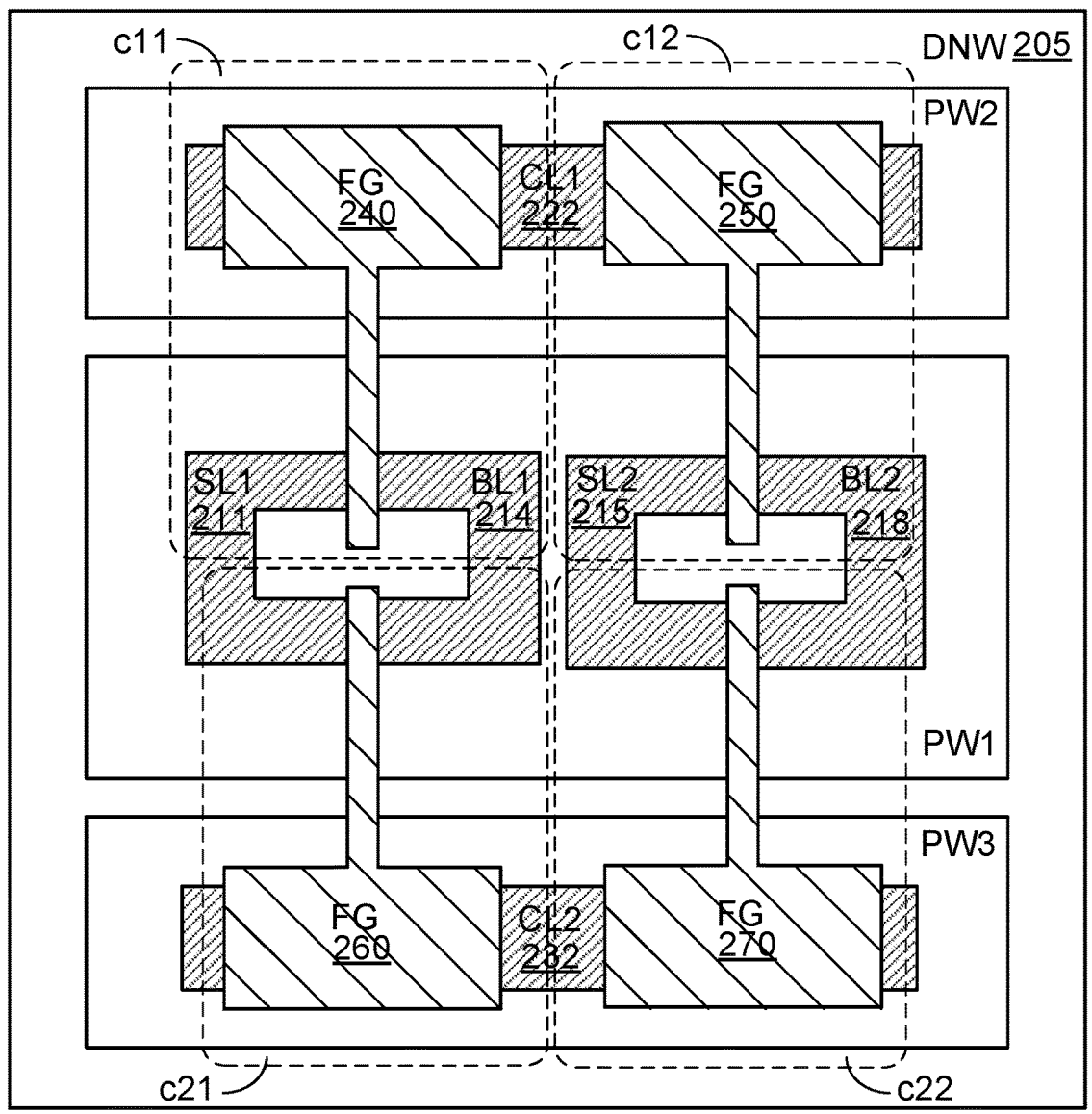
Figure 2D:
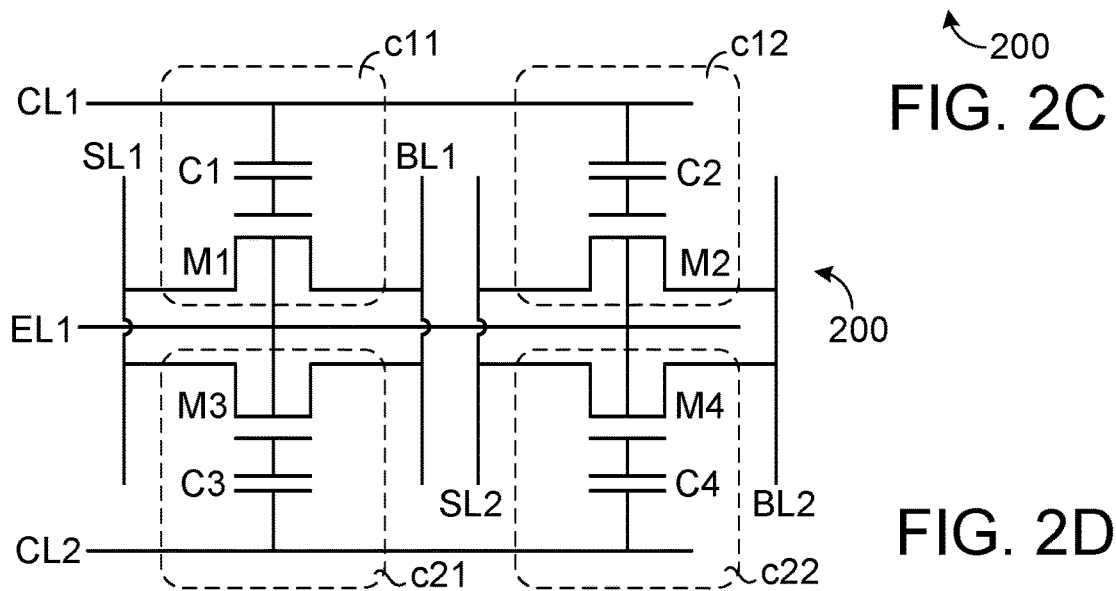
FIG. 2D is a schematic equivalent circuit diagram illustrating the memory cell array according to the first embodiment of the present invention.

FIGS. 2A, 2B and 2C are schematic views illustrating a process of manufacturing a memory cell array of a multi-time programmable memory according to a first embodiment of the present invention. FIG. 2D is a schematic equivalent circuit diagram illustrating the memory cell array according to the first embodiment of the present invention. The memory cells of the memory cell array are arranged in an m×n array. For succinctness, the memory cell array 200 with 2×2 memory cells will be described as follows.

Please refer to FIG. 2A. Firstly, a deep N-type well region (DNW) 205 is formed in a semiconductor substrate (not shown). Then, three isolated P-type well regions PW1, PW2 and PW3 are formed in the deep N-type well region (DNW) 205. That is, three independent isolation regions are formed. In some other embodiments, the deep N-type well region (DNW) 205 is replaced by an N-type buried layer (NBL). Since the semiconductor characteristics of the deep N-type well region (DNW) or the N-type buried layer (NBL) are different from those of the P-type well regions, the three isolated P-type well regions PW1, PW2 and PW3 are isolated by the deep N-type well region (DNW) 205 or the N-type buried layer (NBL).

As shown in FIG. 2B, plural polysilicon gate layers 240, 250, 260 and 270 are formed. The gate layers 240 and 250 are extended from the P-type well region PW1 to the P-type well region PW2. The gate layers 260 and 270 are extended from the P-type well region PW1 to the P-type well region PW3. Moreover, the plural polysilicon gate layers 240, 250, 260 and 270 are served as floating gates (FG) of floating gate transistors.

Please refer to FIG. 2C. After an ion implantation process is performed by using the polysilicon gate layers 240, 250, 260 and 270 as the implantation mask, plural N-type doped regions 222, 211, 214, 215, 218 and 232 are formed. The N-type doped regions 211, 214, 215 and 218 are formed in the P-type well region PW1. The N-type doped region 222 is formed in the P-type well region PW2. The N-type doped region 232 is formed in the P-type well region PW3.

Moreover, plural metal layers are connected with the n-type doped regions 222, 211, 214, 215, 218, 232 and the P-type well region PW1. For example, a source line SL1 is connected with the n-type doped region 211, a bit line BL1 is connected with the n-type doped region 214, a source line SL2 is connected with the n-type doped region 215, and a bit line BL2 is connected to the n-type doped region 218. Moreover, a coupling line CL1 is connected with the n-type doped region 222, a coupling line CL2 is connected with the n-type doped region 232, and an erase line EL1 is connected with the P-type well region PW1.

As shown in FIG. 2C, the memory cell array 200 comprises four memory cells c11~c22. Each memory cell comprises a floating gate transistor and a capacitor, and the floating gate transistor is a single-gate floating gate transistor. Since each of the memory cells c11~c22 of the memory cell array 200 comprises one transistor and one capacitor, the memory cell is referred as a 1T1C cell.

Please refer to FIGS. 2C and 2D. In the memory cell c11, the n-type doped regions 211 and 214 are located beside both sides of the gate layer 240, respectively. Consequently, the gate layer 240, the n-type doped region 211, the n-type doped region 214 and the P-type well region PW1 are collaboratively formed as a floating gate transistor M1, and the gate layer 240 and the n-type doped region 222 are collaboratively formed as a capacitor C1. In the memory cell c12, the n-type doped regions 215 and 218 are located beside both sides of the gate layer 250, respectively. Consequently, the gate layer 250, the n-type doped region 215, the n-type doped region 218 and the P-type well region PW1 are collaboratively formed as a floating gate transistor M2, and the gate layer 250 and the n-type doped region 222 are collaboratively formed as a capacitor C2. In the memory cell c21, the n-type doped regions 211 and 214 are located beside both sides of the gate layer 260, respectively. Consequently, the gate layer 260, the n-type doped region 211, the n-type doped region 214 and the P-type well region PW1 are collaboratively formed as a floating gate transistor M3, and the gate layer 260 and the n-type doped region 232 are collaboratively formed as a capacitor C3. In the memory cell c22, the n-type doped regions 215 and 218 are located beside both sides of the gate layer 270, respectively. Consequently, the gate layer 270, the n-type doped region 215, the n-type doped region 218 and the p-type well region PW1 are collaboratively formed as a floating gate transistor M4, and the gate layer 270 and the n-type doped region 232 are collaboratively formed as a capacitor C4.

In the memory cell array 200 of this embodiment, the floating gate transistors M1~M4 of the four memory cells c11~c22 in different rows are all constructed in the P-well region PW1. Moreover, the P-well region PW1 is connected with the erase line EL1. In other words, the body terminals of the four floating gate transistors M1~M4 are all connected with the erase line EL1.

As shown in FIG. 2D, the memory cell array 200 comprises four memory cells c11~c22, which are arranged in a 2×2 array. Moreover, the memory cell array 200 is connected with the coupling lines CL1, CL2, the source lines SL1, SL2, the bit lines BL1, BL2, and the erase line EL1. The first row of the memory cell array 200 includes the two memory cells c11 and c12. The second row of the memory cell array 200 includes the two memory cells c21 and c22. Moreover, the memory cells of the memory cell array 200 in the same row are collaboratively formed as one page.

In the memory cell c11, the first drain/source terminal of the floating gate transistor M1 is connected with the source line SL1, the second drain/source terminal of the floating gate transistor M1 is connected with the bit line BL1, and the body terminal of the floating gate transistor M1 is connected with the erase line EL1. Moreover, the first terminal of the capacitor C1 is connected with the floating gate of the floating gate transistor M1, and the second terminal of the capacitor C1 is connected with the coupling line CL1. In the memory cell c12, the first drain/source terminal of the floating gate transistor M2 is connected with the source line SL2, the second drain/source terminal of the floating gate transistor M2 is connected with the bit line BL2, and the body terminal of the floating gate transistor M2 is connected with the erase line EL1. Moreover, the first terminal of the capacitor C2 is connected with the floating gate of the floating gate transistor M2, and the second terminal of the capacitor C2 is connected with the coupling line CL1. In the memory cell c21, the first drain/source terminal of the floating gate transistor M3 is connected with the source line SL1, the second drain/source terminal of the floating gate transistor M3 is connected with the bit line BL1, and the body terminal of the floating gate transistor M3 is connected with the erase line EL1. Moreover, the first terminal of the capacitor C3 is connected with the floating gate of the floating gate transistor M3, and the second terminal of the capacitor C3 is connected with the coupling line CL2. In the memory cell c22, the first drain/source terminal of the floating gate transistor M4 is connected with the source line SL2, the second drain/source terminal of the floating gate transistor M4 is connected with the bit line BL2, and the body terminal of the floating gate transistor M4 is connected with the erase line EL1. Moreover, the first terminal of the capacitor C4 is connected with the floating gate of the floating gate transistor M4, and the second terminal of the capacitor C4 is connected with the coupling line CL2.

Generally, by providing proper bias voltages to the coupling lines CL1, CL2, the source lines SL1, SL2, the bit lines BL1, BL2, the erase lines EL1, the P-type wells PW2, PW3 and the deep N-type well region (DNW) 205, program actions, erase actions or read actions can be performed on the memory cells c11~c22 of the memory cell array 200. The associated operations will be described as follows.

Figure 3A:
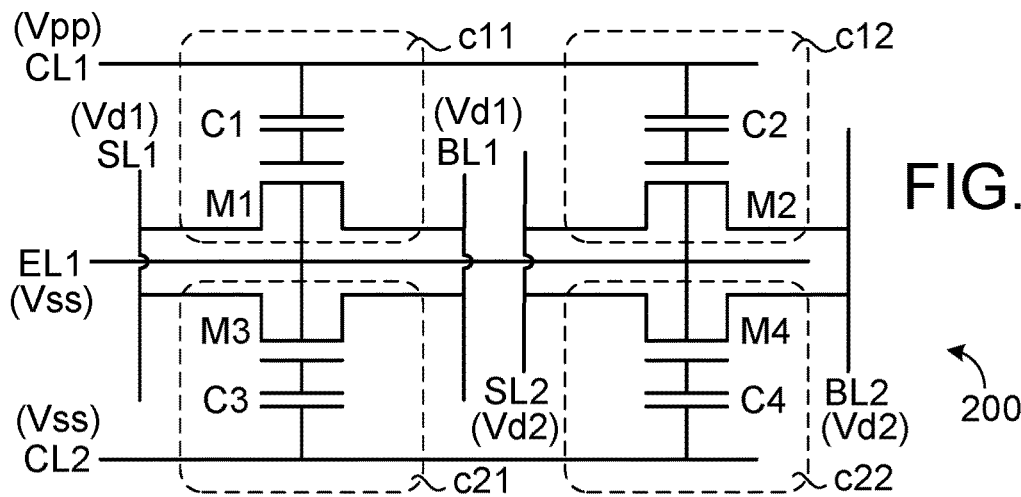
FIGS. 3A-3C schematically illustrate the bias voltages for performing various actions on the memory cell array of the first embodiment of the present invention.
Figure 3B:
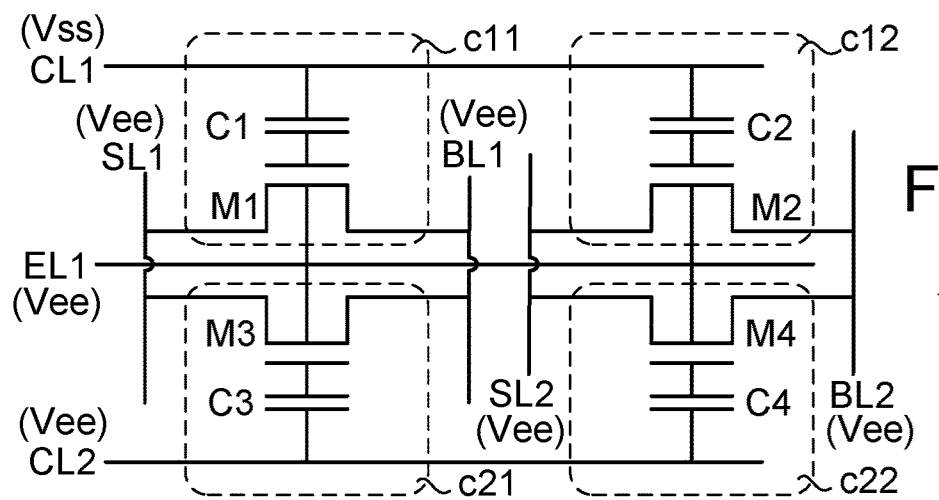
Figure 3C:
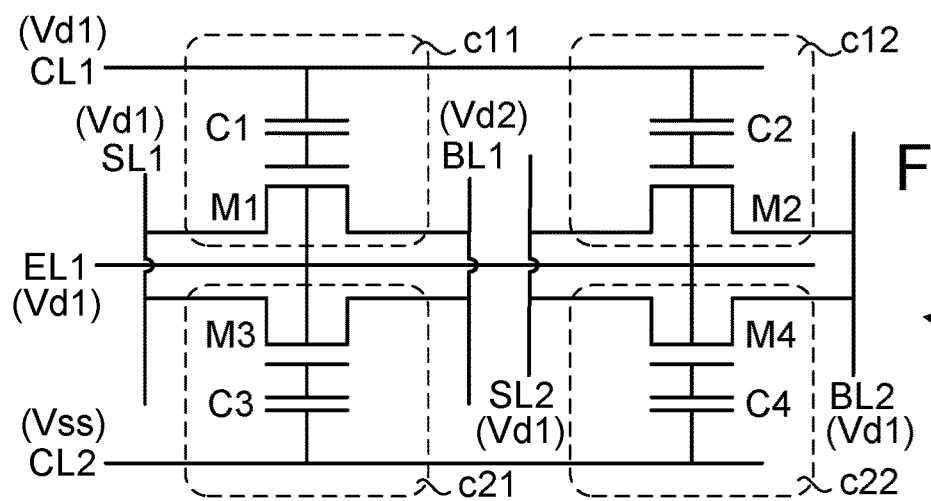

FIGS. 3A-3C schematically illustrate the bias voltages for performing various actions on the memory cell array of the first embodiment of the present invention. During the operation of the memory cell array, only one row is a selected row, and the other rows are unselected row.

Please refer to FIG. 3A. During the program action, the coupling line CL1 receives the program voltage (Vpp), the coupling line CL2 receives the lowest voltage (Vss), the source line SL1 and the bit line BL1 receive the first supply voltage (Vd1), the source line SL2 and the bit line BL2 receives the second supply voltage (Vd2), and the erase line EL1 receives the lowest voltage (Vss). In addition, the voltage received by the P-type well region PW2 and the voltage received by the coupling line CL1 are equal, i.e., the program voltage (Vpp). The voltage received by the P-type well region PW3 and the voltage received by the coupling line CL2 are equal, i.e., the lowest voltage (Vss). The deep N-type well region (DNW) receives the program voltage (Vpp). The program voltage (Vpp) is higher than the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the program voltage (Vpp) is 8V, the second supply voltage (Vd2) is 5V, the first supply voltage (Vd1) is 1V, and the lowest voltage (Vss) is 0V. Furthermore, the first supply voltage (Vd1) may be equal to the lowest voltage (Vss).

During the program action, the coupling line CL1 receives the program voltage (Vpp), and the coupling line CL2 receives the lowest voltage (Vss). Consequently, the row of the memory cell array 200 connected to the coupling line CL1 (i.e., the first row) is the selected row, and the row of the memory cell array 200 connected to the coupling line CL2 (i.e., the second row) is the unselected row. The memory cells c21 and c22 in the unselected row cannot be programmed.

In the selected row, the source line SL1 and the bit line BL1 receive the first supply voltage (Vd1). Consequently, hot carriers (e.g., electrons) are injected into the floating gate of the floating gate transistor M1 of the memory cell c11 through a Fowler-Nordheim tunneling effect (i.e., a FN tunneling effect). Under this circumstance, the memory cell c11 is programmed to a first storage state. In the meantime, the source line SL2 and the bit line BL2 receive the second supply voltage (Vd2). Consequently, no hot carriers (e.g., electrons) are injected into the floating gate of the floating gate transistor M2 of the memory cell c12. Under this circumstance, the memory cell c12 is programmed to a second storage state. In other words, by properly controlling the voltages of the source lines SL1, SL2 and the bit lines BL1, BL2, the memory cells c11 and c12 in the selected row can be programmed to the first storage state or the second storage state.

Please refer to FIG. 3B. During the erase action, the coupling line CL1 receives the lowest voltage (Vss), the coupling line CL2 receives the erase voltage (Vee), the source lines SL1, SL2 and the bit lines BL1, BL2 receive the erase voltage (Vee), and the erase line EL1 receives the erase voltage. (Vee). The voltage received by the P-type well region PW2 and the voltage received by the coupling line CL1 are equal, i.e., the lowest voltage (Vss). The voltage received by the P-type well region PW3 and the voltage received by the coupling line CL2 are equal, i.e., the erase voltage (Vee). The deep N-type well region (DNW) receives the erase voltage (Vee). The erase voltage (Vee) is higher than the lowest voltage (Vss). The lowest voltage (Vss) is lower than or equal to 0V. For example, the erase voltage (Vee) is 12V, and the lowest voltage (Vss) is 0V.

During the erase action, the coupling line CL1 receives the lowest voltage (Vss), and the coupling line CL2 receives the erase voltage (Vee). Consequently, the row of the memory cell array 200 connected to the coupling line CL1 (i.e., the first row) is the selected row, and the row of the memory cell array 200 connected to the coupling line CL2 (i.e., the second row) is the unselected row. The memory cells c21 and c22 in the unselected row cannot be erased.

In the selected row, the erase line EL1, the source lines SL1, SL2 and the bit lines BL1, BL2 receive the erase voltage (Vee). Consequently, hot carriers (e.g., electrons) are ejected from the floating gates of the floating gate transistors M1, M2 of the memory cells c11 and c12 through a Fowler-Nordheim tunneling effect (i.e., a FN tunneling effect). Under this circumstance, the memory cells c11 and c12 are erased to the second storage state. In other words, during the erase action, all of the memory cells in the selected row (i.e., the memory cells in the selected page) are erased to the second storage state.

Please refer to FIG. 3C. During the read action, the coupling line CL1 receives the first supply voltage (Vd1), the coupling line CL2 receives the lowest voltage (Vss), the source line SL1 receives the first supply voltage (Vd1), the bit line BL1 receives the second supply voltage (Vd2), the source line SL2 and the bit line BL2 receive the first supply voltage (Vd1), and the erase line EL1 receives the first supply voltage (Vd1). The voltage received by the P-type well region PW2 and the voltage received by the coupling line CL1 are equal, i.e., the first supply voltage (Vd1). The voltage received by the P-type well region PW3 and the voltage received by the coupling line CL2 are equal, i.e., the lowest voltage (Vss). The deep N-type well region (DNW) receives the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the second supply voltage (Vd2) is 5V, the first supply voltage (Vd1) is 1V, and the lowest voltage (Vss) is 0V.

During the read action, the coupling line CL1 receives the first supply voltage (Vd1), and the coupling line CL2 receives the lowest voltage (Vss). Consequently, the row of the memory cell array 200 connected to the coupling line CL1 (i.e., the first row) is the selected row, and the row of the memory cell array 200 connected to the coupling line CL2 (i.e., the second row) is the unselected row. The memory cells c21 and c22 in the unselected row cannot be read.

In the selected row, the source line SL1 receives the first supply voltage (Vd1), and the bit line BL1 receives the second supply voltage (Vd2). Consequently, the memory cell c11 generates a read current. The read current flows from the bit line BL1 to the source line SL1 through the floating gate transistor M1. Moreover, the magnitude of the read current is determined according to the storage state of the memory cell c11. For example, the read current corresponding to the first storage state is lower than the read current corresponding to the second storage state. During the read action, the storage state of the memory cell c11 can be judged according to the magnitude of the read current generated by the memory cell c11.

Since the source line SL2 and the bit line BL2 receive the first supply voltage (Vd1), the memory cell c12 does not generate a read current. In other words, by controlling any memory cell of the selected row to generate the read current or not generate the read current, the storage state of the memory cell can be judged.

As mentioned above, the floating gate transistors of the memory cells in different rows of the memory cell array 200 are constructed in the same P-type well region PW1. Consequently, the chip size can be largely reduced. Although the floating gate transistors of the memory cells in different rows are constructed in the same P-type well region PW1, only the stored data in the memory cells of the selected row (or the selected page) can be read during the read action. That is, the stored data in the memory cells of the unselected row (or the unselected page) cannot be read.

FIG. 4A is a schematic view illustrating a process of manufacturing a memory cell array of a multi-time programmable memory according to a second embodiment of the present invention. FIG. 4B is a schematic equivalent circuit diagram illustrating the memory cell array according to the second embodiment of the present invention. The memory cells of the memory cell array are arranged in an m×n array. For succinctness, the memory cell array 400 with 2×2 memory cells will be described as follows. The process of manufacturing the memory cell array of this embodiment is similar to that of the first embodiment.

Please refer to FIG. 4A. Firstly, a deep N-type well region (DNW) 405 is formed in a semiconductor substrate (not shown). Then, three isolated P-type well regions PW1, PW2 and PW3 are formed in the deep N-type well region (DNW) 405. That is, three independent isolation regions are formed. In some other embodiments, the deep N-type well region (DNW) 405 is replaced by an N-type buried layer (NBL).

Then, plural polysilicon gate layers 440, 442, 450, 452, 460, 462, 470 and 472 are formed. The gate layers 440 and 450 are extended from the P-type well region PW1 to the P-type well region PW2. The gate layers 460 and 470 are extended from the P-type well region PW1 to the P-type well region PW3. Moreover, the plural polysilicon gate layers 440, 450, 460 and 470 are served as floating gates (FG) of floating gate transistors. The gate layer 442 is constructed in the P-type well region PW1 and located beside the gate layer 440. The gate layer 452 is constructed in the P-type well region PW1 and located beside of the gate layer 450. The gate layer 462 is constructed in the P-type well area PW1 and located beside the gate layer 460. The gate layer 472 is constructed in the P-well region PW1 and located beside the gate layer 470.

After an ion implantation process is performed by using the polysilicon gate layers 440, 442, 450, 452, 460, 462, 470 and 472 as the implantation mask, plural N-type doped regions 422, 411, 413, 414, 415, 417, 418 and 432 are formed. The N-type doped regions 411, 413, 414, 415, 417 and 418 are formed in the P-type well region PW1. The N-type doped region 422 is formed in the P-type well region PW2. The N-type doped region 432 is formed in the P-type well region PW3.

Moreover, plural metal layers are connected with the n-type doped regions 422, 411, 414, 415, 418, 432 and the P-type well region PW1. For example, a source line SL1 is connected with the n-type doped region 411, a bit line BL1 is connected with the n-type doped region 414, a source line SL2 is connected with the n-type doped region 415, and a bit line BL2 is connected to the n-type doped region 418. Moreover, a coupling line CL1 is connected with the n-type doped region 422, a coupling line CL2 is connected with the n-type doped region 432, and an erase line EL1 is connected with the P-type well region PW1. Then, plural metal layers are connected with the gate layers 442, 452, 462 and 472. That is, a word line WL1 is connected with the gate layers 442 and 452, and a word line WL2 is connected with the gate layers 462 and 472.

As shown in FIG. 4A, the memory cell array 400 comprises four memory cells c11~c22. Each memory cell comprises a floating gate transistor, a select transistor and a capacitor, and the floating gate transistor is a single-gate floating gate transistor. Since each of the memory cells c11~c22 of the memory cell array 400 comprises two transistors and one capacitor, the memory cell is referred as a 2T1C cell.

Please refer to FIGS. 4A and 4B. In the memory cell c11, the n-type doped regions 411 and 413 are respectively located beside both sides of the gate layer 440, and the n-type doped regions 413 and 414 are respectively located beside both sides of the gate layer 442. Consequently, the gate layer 440, the n-type doped region 411, the n-type doped region 413 and the P-type well region PW1 are collaboratively formed as a floating gate transistor M1. The gate layer 442, the n-type doped region 413, the n-type doped region 414 and the P-type well region PW1 are collaboratively formed as a select transistor Ma. Moreover, the gate layer 440 and the n-type doped region 422 are collaboratively formed as a capacitor C1. In the memory cell c12, the n-type doped regions 415 and 417 are respectively located beside both sides of the gate layer 450, and the n-type doped regions 417 and 418 are respectively located beside both sides of the gate layer 452. Consequently, the gate layer 450, the n-type doped region 415, the n-type doped region 417 and the P-type well region PW1 are collaboratively formed as a floating gate transistor M2. The gate layer 452, the n-type doped region 417, the n-type doped region 418 and the P-type well region PW1 are collaboratively formed as a select transistor Mb. Moreover, the gate layer 450 and the n-type doped region 422 are collaboratively formed as a capacitor C2. In the memory cell c21, the n-type doped regions 411 and 437 are respectively located beside both sides of the gate layer 460, and the n-type doped regions 437 and 414 are respectively located beside both sides of the gate layer 462. Consequently, the gate layer 460, the n-type doped region 411, the n-type doped region 437 and the P-type well region PW1 are collaboratively formed as a floating gate transistor M3. The gate layer 462, the n-type doped region 437, the n-type doped region 414 and the P-type well region PW1 are collaboratively formed as a select transistor Mc. Moreover, the gate layer 460 and the n-type doped region 432 are collaboratively formed as a capacitor C3. In the memory cell c22, the n-type doped regions 415 and 427 are respectively located beside both sides of the gate layer 470, and the n-type doped regions 427 and 418 are respectively located beside both sides of the gate layer 472. Consequently, the gate layer 470, the n-type doped region 415, the n-type doped region 427 and the P-type well region PW1 are collaboratively formed as a floating gate transistor M4. The gate layer 472, the n-type doped region 427, the n-type doped region 418 and the P-type well region PW1 are collaboratively formed as a select transistor Md. Moreover, the gate layer 470 and the n-type doped region 432 are collaboratively formed as a capacitor C4.

In the memory cell array 400 of this embodiment, the floating gate transistors M1~M4 and the select transistors Ma~Md of the four memory cells c11~c22 in different rows are all constructed in the P-well region PW1. Moreover, the P-well region PW1 is connected with the erase line EL1. In other words, the body terminals of the four floating gate transistors M1~M4 and the four select transistors Ma~Md are all connected with the erase line EL1.

As shown in FIG. 4B, the memory cell array 400 comprises four memory cells c11~c22, which are arranged in a 2×2 array. Moreover, the memory cell array 400 is connected with the word lines WL1, WL2, the coupling lines CL1, CL2, the source lines SL1, SL2, the bit lines BL1, BL2, and the erase line EL1. The first row of the memory cell array 400 includes the two memory cells c11 and c12. The second row of the memory cell array 400 includes the two memory cells c21 and c22. Moreover, the memory cells of the memory cell array 400 in the same row are collaboratively formed as one page.

In the memory cell c11, the first drain/source terminal of the floating gate transistor M1 is connected with the source line SL1, the second drain/source terminal of the floating gate transistor M1 is connected with the first drain/source terminal of the select transistor Ma, the second drain/source terminal of the select transistor Ma is connected with the bit line BL1, the gate terminal of the select transistor Ma is connected with the word line WL1, and the body terminals of the floating gate transistor M1 and the select transistor Ma are connected with the erase line EL1. Moreover, the first terminal of the capacitor C1 is connected with the floating gate of the floating gate transistor M1, and the second terminal of the capacitor C1 is connected with the coupling line CL1. In the memory cell c12, the first drain/source terminal of the floating gate transistor M2 is connected with the source line SL2, the second drain/source terminal of the floating gate transistor M2 is connected with the first drain/source terminal of the select transistor Mb, the second drain/source terminal of the select transistor Mb is connected with the bit line BL2, the gate terminal of the select transistor Mb is connected with the word line WL1, and the body terminals of the floating gate transistor M2 and the select transistor Mb are connected with the erase line EL1. Moreover, the first terminal of the capacitor C2 is connected with the floating gate of the floating gate transistor M2, and the second terminal of the capacitor C2 is connected with the coupling line CL1. In the memory cell c21, the first drain/source terminal of the floating gate transistor M3 is connected with the source line SL1, the second drain/source terminal of the floating gate transistor M3 is connected with the first drain/source terminal of the select transistor Mc, the second drain/source terminal of the select transistor Mc is connected with the bit line BL1, the gate terminal of the select transistor Mc is connected with the word line WL2, and the body terminals of the floating gate transistor M3 and the select transistor Mc are connected with the erase line EL1. Moreover, the first terminal of the capacitor C3 is connected with the floating gate of the floating gate transistor M3, and the second terminal of the capacitor C3 is connected with the coupling line CL2. In the memory cell c22, the first drain/source terminal of the floating gate transistor M4 is connected with the source line SL2, the second drain/source terminal of the floating gate transistor M4 is connected with the first drain/source terminal of the select transistor Md, the second drain/source terminal of the select transistor Md is connected with the bit line BL2, the gate terminal of the select transistor Md is connected with the word line WL2, and the body terminals of the floating gate transistor M4 and the select transistor Md are connected with the erase line EL1. Moreover, the first terminal of the capacitor C4 is connected with the floating gate of the floating gate transistor M4, and the second terminal of the capacitor C4 is connected with the coupling line CL2.

Generally, by providing proper bias voltages to the word lines WL1, WL2, the coupling lines CL1, CL2, the source lines SL1, SL2, the bit lines BL1, BL2, the erase lines EL1, the P-type wells PW2, PW3 and the deep N-type well region (DNW) 405, program actions, erase actions or read actions can be performed on the memory cells c11~c22 of the memory cell array 400. The associated operations will be described as follows.

Figure 5A:
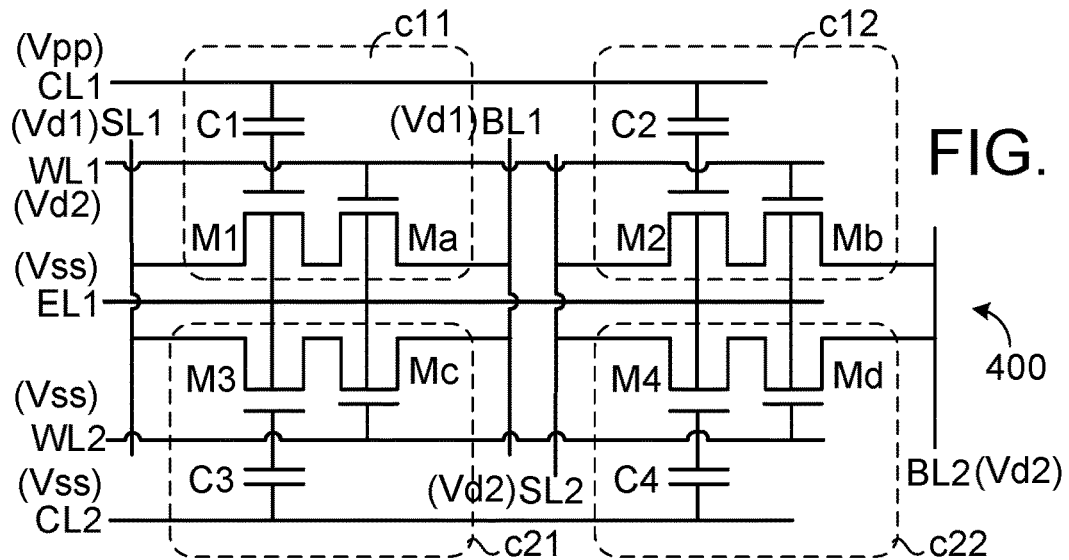
FIGS. 5A-5C schematically illustrate the bias voltages for performing various actions on the memory cell array of the second embodiment of the present invention.
Figure 5B:
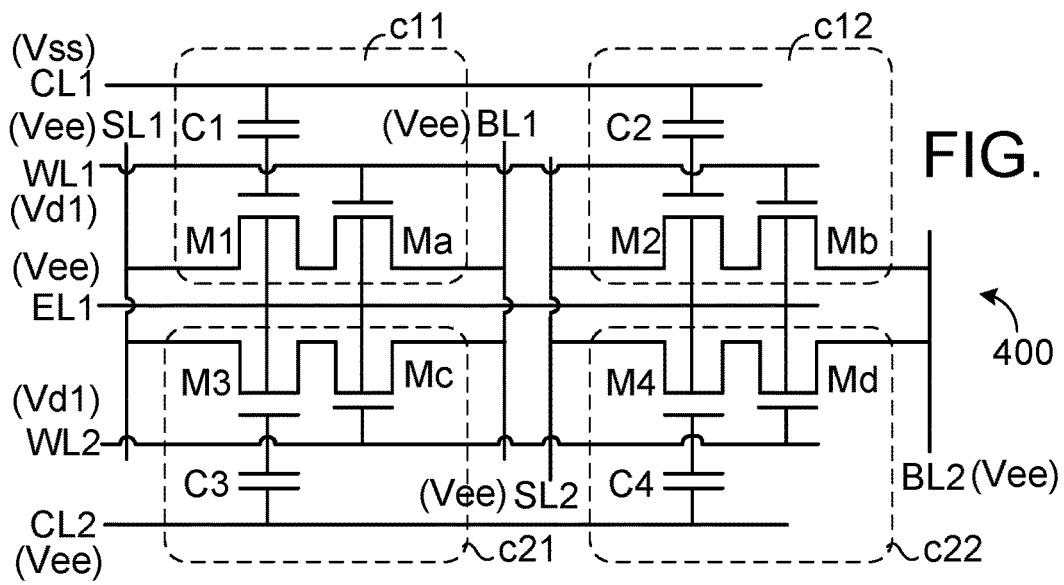
Figure 5C:
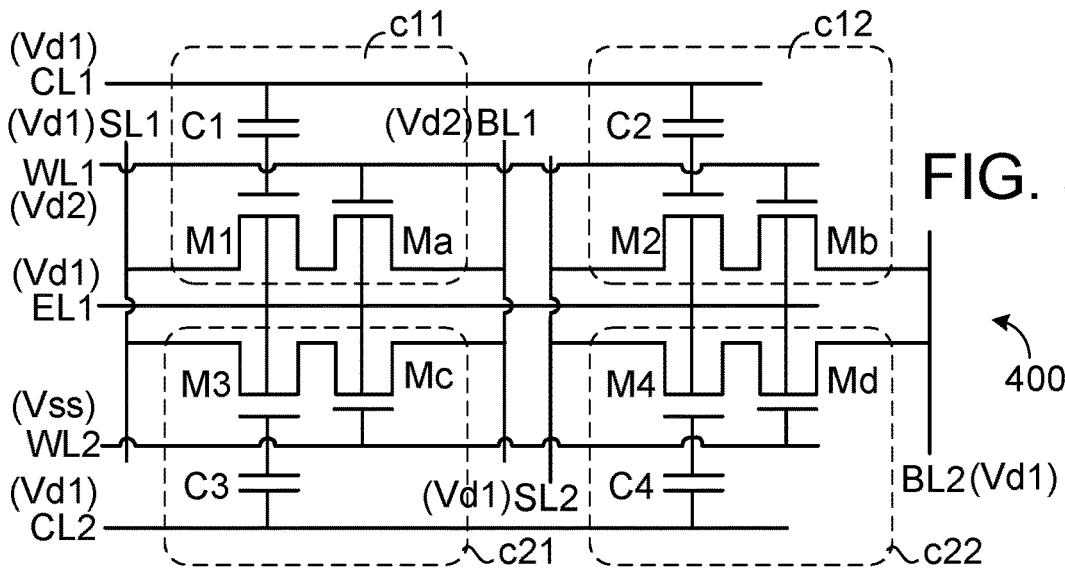

FIGS. 5A-5C schematically illustrate the bias voltages for performing various actions on the memory cell array of the second embodiment of the present invention. During the operation of the memory cell array 400, only one row is a selected row, and the other row are unselected row.

Please refer to FIG. 5A. During the program action, the coupling line CL1 receives the program voltage (Vpp), the coupling line CL2 receives the lowest voltage (Vss), the word line WL1 receives the second supply voltage (Vd2), the word line WL2 receives the lowest voltage (Vss), the source line SL1 and the bit line BL1 receive the first supply voltage (Vd1), the source line SL2 and the bit line BL2 receives the second supply voltage (Vd2), and the erase line EL1 receives the lowest voltage (Vss). The voltage received by the P-type well region PW2 and the voltage received by the coupling line CL1 are equal, i.e., the program voltage (Vpp). The voltage received by the P-type well region PW3 and the voltage received by the coupling line CL2 are equal, i.e., the lowest voltage (Vss). The deep N-type well region (DNW) receives the program voltage (Vpp). The program voltage (Vpp) is higher than the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the program voltage (Vpp) is 8V, the second supply voltage (Vd2) is 5V, the first supply voltage (Vd1) is 1V.

During the program action, the coupling line CL1 receives the program voltage (Vpp) and the word line WL1 receives the second supply voltage (Vd2). Consequently, the row of the memory cell array 400 connected to the coupling line CL1 and the word line WL1 (i.e., the first row) is the selected row. Moreover, during the program action, the coupling line CL2 receives the lowest voltage (Vss) and the word line WL2 receives the lowest voltage (Vss). Consequently, the row of the memory cell array 400 connected to the coupling line CL2 and the word line WL2 (i.e., the second row) is the unselected row. The memory cells c21 and c22 in the unselected row cannot be programmed.

In the selected row, the source line SL1 and the bit line BL1 receive the first supply voltage (Vd1), and the word line WL1 receives the second supply voltage (Vd2). Consequently, the select transistor Ma is turned on, and hot carriers (e.g., electrons) are injected into the floating gate of the floating gate transistor M1 of the memory cell c11 through a Fowler-Nordheim tunneling effect (i.e., a FN tunneling effect). Under this circumstance, the memory cell c11 is programmed to a first storage state. the source line SL2 and the bit line BL2 receive the second supply voltage (Vd2), and the word line WL1 receives the second supply voltage (Vd2). Consequently, the transistor Mb is turned off, and no hot carriers (e.g., electrons) are injected into the floating gate of the floating gate transistor M2 of the memory cell c12. Under this circumstance, the memory cell c12 is programmed to a second storage state. In other words, by properly controlling the voltages of the source lines SL1, SL2 and the bit lines BL1, BL2, the memory cells c11 and c12 in the selected row can be programmed to the first storage state or the second storage state.

Please refer to FIG. 5B. During the erase action, the coupling line CL1 receives the lowest voltage (Vss), the coupling line CL2 receives the erase voltage (Vee), the word line WL1 and the word line WL2 receive the first supply voltage (Vd1), the source lines SL1, SL2 and the bit lines BL1, BL2 receive the erase voltage (Vee), and the erase line EL1 receives the erase voltage. (Vee). The voltage received by the P-type well region PW2 and the voltage received by the coupling line CL1 are equal, i.e., the lowest voltage (Vss). The voltage received by the P-type well region PW3 and the voltage received by the coupling line CL2 are equal, i.e., the erase voltage (Vee). The deep N-type well region (DNW) receives the erase voltage (Vee). The erase voltage (Vee) is higher than the lowest voltage (Vss). The lowest voltage (Vss) is lower than or equal to 0V. For example, the erase voltage (Vee) is 12V, and the lowest voltage (Vss) is 0V.

During the erase action, the coupling line CL1 receives the lowest voltage (Vss), and the coupling line CL2 receives the erase voltage (Vee). Consequently, the row of the memory cell array 400 connected to the coupling line CL1 (i.e., the first row) is the selected row, and the row of the memory cell array 400 connected to the coupling line CL2 (i.e., the second row) is the unselected row. The memory cells c21 and c22 in the unselected row cannot be erased.

In the selected row, the erase line EL1, the source lines SL1, SL2 and the bit lines BL1, BL2 receive the erase voltage (Vee). Consequently, hot carriers (e.g., electrons) are ejected from the floating gates of the floating gate transistors M1, M2 of the memory cells c11 and c12 through a Fowler-Nordheim tunneling effect (i.e., a FN tunneling effect). Under this circumstance, the memory cells c11 and c12 are erased to the second storage state. In other words, during the erase action, all of the memory cells in the selected row (i.e., the memory cells in the selected page) are erased to the second storage state.

Please refer to FIG. 5C. During the read action, the coupling line CL1 receives the first supply voltage (Vd1), the coupling line CL2 receives the first supply voltage (Vd1), the word line WL1 receives the second supply voltage (Vd2), the word line WL2 receives the lowest voltage (Vss), the source line SL1 receives the first supply voltage (Vd1), the bit line BL1 receives the second supply voltage (Vd2), the source line SL2 and the bit line BL2 receive the first supply voltage (Vd1), and the erase line EL1 receives the first supply voltage (Vd1). The voltage received by the P-type well region PW2 and the voltage received by the coupling line CL1 are equal, i.e., the first supply voltage (Vd1). The voltage received by the P-type well region PW3 and the voltage received by the coupling line CL2 are equal, i.e., the first supply voltage (Vd1). The deep N-type well region (DNW) receives the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the second supply voltage (Vd2) is 5V, the first supply voltage (Vd1) is 1V, and the lowest voltage (Vss) is 0V.

During the read action, the coupling line CL1 receives the first supply voltage (Vd1) and the word line WL1 receives the second supply voltage (Vd2). Consequently, the row of the memory cell array 400 connected to the coupling line CL1 (i.e., the first row) is the selected row. Moreover, during the read action, the coupling line CL2 receives the first supply voltage (Vd1) and the word line WL2 receives the lowest voltage (Vss). Consequently, the row of the memory cell array 400 connected to the coupling line CL2 (i.e., the second row) is the unselected row. The memory cells c21 and c22 in the unselected row cannot be read.

In the selected row, the word line WL1 receives the second supply voltage (Vd2), the source line SL1 receives the first supply voltage (Vd1), and the bit line BL1 receives the second supply voltage (Vd2). Consequently, the select transistor Ma is turned on, and the memory cell c11 generates a read current. The read current flows from the bit line BL1 to the source line SL1 through the floating gate transistor M1. Moreover, the magnitude of the read current is determined according to the storage state of the memory cell c11. For example, the read current corresponding to the first storage state is lower than the read current corresponding to the second storage state. During the read action, the storage state of the memory cell c11 can be judged according to the magnitude of the read current generated by the memory cell c11. Moreover, the word line WL1 receives the second supply voltage (Vd2), and the source line SL2 and the bit line BL2 receive the first supply voltage (Vd1). Consequently, the select transistor Mb is turned off, and the memory cell c12 does not generate a read current. In other words, by controlling ant memory cell of the selected row to generate the read current or not generate the read current, the storage state of the memory cell can be judged.

As mentioned above, the floating gate transistors and the select transistors of the memory cells in different rows of the memory cell array 400 are constructed in the same P-type well region PW1. Consequently, the chip size can be largely reduced. Although the floating gate transistors of the memory cells in different rows are constructed in the same P-type well region PW1, only the stored data in the memory cells of the selected row (or the selected page) can be read during the read action. That is, the stored data in the memory cells of the unselected row (or the unselected page) cannot be read.

Figure 6A:
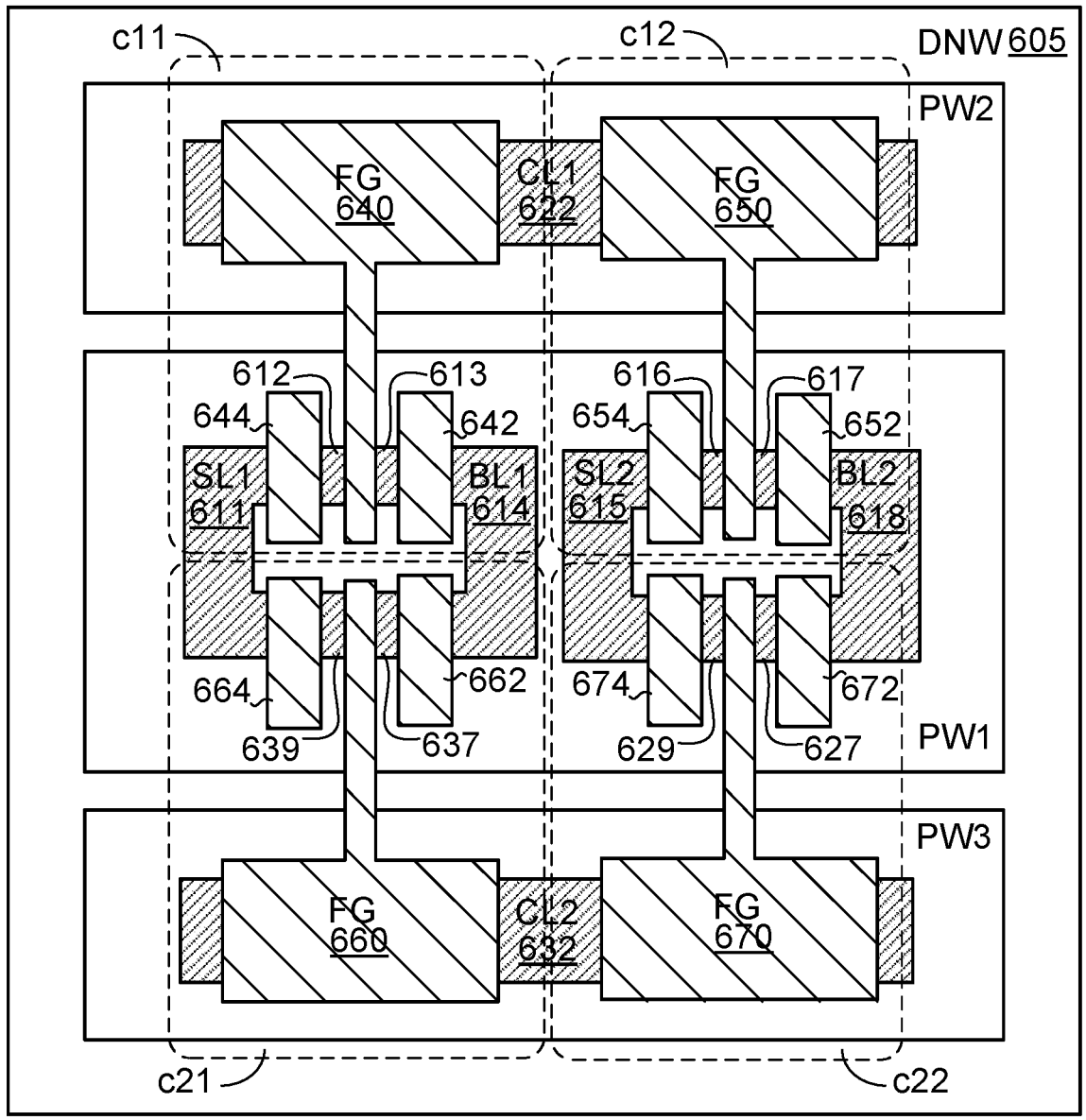
FIG. 6A is a schematic view illustrating a process of manufacturing a memory cell array of a multi-time programmable memory according to a third embodiment of the present invention.
Figure 6B:
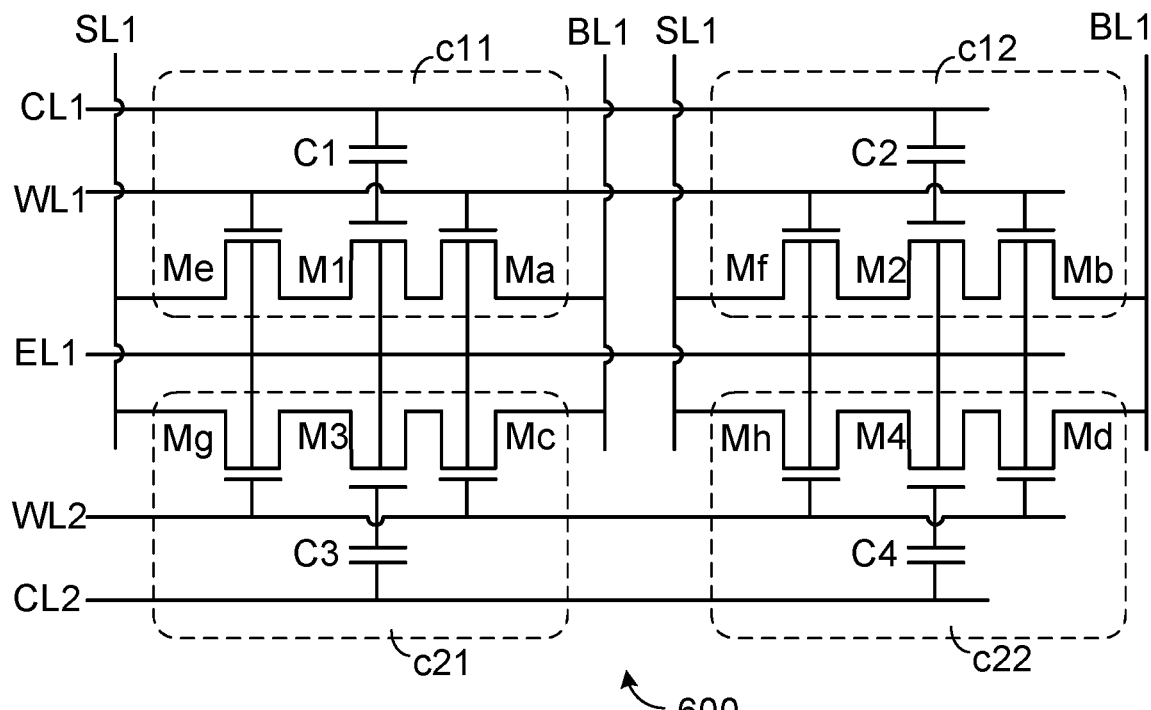
FIG. 6B is a schematic equivalent circuit diagram illustrating the memory cell array according to the third embodiment of the present invention.

FIG. 6A is a schematic view illustrating a process of manufacturing a memory cell array of a multi-time programmable memory according to a third embodiment of the present invention. FIG. 6B is a schematic equivalent circuit diagram illustrating the memory cell array according to the third embodiment of the present invention. The memory cells of the memory cell array are arranged in an m×n array. For succinctness, the memory cell array 600 with 2×2 memory cells will be described as follows. The process of manufacturing the memory cell array of this embodiment is similar to that of the first embodiment.

Please refer to FIG. 6A. Firstly, a deep N-type well region (DNW) 605 is formed in a semiconductor substrate (not shown). Then, three isolated P-type well regions PW1, PW2 and PW3 are formed in the deep N-type well region (DNW) 605. That is, three independent isolation regions are formed. In some other embodiments, the deep N-type well region (DNW) 605 is replaced by an N-type buried layer (NBL).

Then, plural polysilicon gate layers 640, 642, 644, 650, 652, 654, 660, 662, 664, 670, 672 and 674 are formed. The gate layers 640 and 650 are extended from the P-type well region PW1 to the P-type well region PW2. The gate layers 660 and 670 are extended from the P-type well region PW1 to the P-type well region PW3. Moreover, the plural polysilicon gate layers 640, 650, 660 and 670 are served as floating gates (FG) of floating gate transistors. The gate layers 642 and 644 are constructed in the P-type well region PW1, and respectively located beside both sides of the gate layer 640. The gate layers 652 and 654 are constructed in the P-type well region PW1, and respectively located beside both sides of the gate layer 650. The gate layers 662 and 664 are constructed in the P-type well region PW1, and respectively located beside both sides of the gate layer 660. The gate layers 672 and 674 are constructed in the P-type well region PW1, and respectively located beside both sides of the gate layer 670.

After an ion implantation process is performed by using the polysilicon gate layers 640, 642, 644, 650, 652, 654, 660, 662, 664, 670, 672 and 674 as the implantation mask, plural N-type doped regions 622, 611-618, 627, 629, 637, 639 and 632 are formed. The N-type doped regions 611-618, 627, 629, 637, 639 are formed in the P-type well region PW1. The N-type doped region 622 is formed in the P-type well region PW2. The N-type doped region 632 is formed in the P-type well region PW3.

Moreover, plural metal layers are connected with the n-type doped regions 622, 611, 614, 615, 618, 632 and the P-type well region PW1. For example, a source line SL1 is connected with the n-type doped region 611, a bit line BL1 is connected with the n-type doped region 614, a source line SL2 is connected with the n-type doped region 615, and a bit line BL2 is connected to the n-type doped region 618. Moreover, a coupling line CL1 is connected with the n-type doped region 622, a coupling line CL2 is connected with the n-type doped region 632, and an erase line EL1 is connected with the P-type well region PW1. Then, plural metal layers are connected with the gate layers 642, 644, 652, 654, 662, 664, 672 and 674. That is, a word line WL1 is connected with the gate layers 642, 644, 652 and 654, and a word line WL2 is connected with the gate layers 662, 664, 672 and 674.

As shown in FIG. 6A, the memory cell array 600 comprises four memory cells c11~c22. Each memory cell comprises a floating gate transistor, a switching transistor, a select transistor and a capacitor, and the floating gate transistor is a single-gate floating gate transistor. Since each of the memory cells c11~c22 of the memory cell array 600 comprises three transistors and one capacitor, the memory cell is referred as a 3T1C cell.

Please refer to FIGS. 6A and 6B. In the memory cell c11, the n-type doped regions 611 and 612 are respectively located beside both sides of the gate layer 644, the n-type doped regions 612 and 613 are respectively located beside both sides of the gate layer 640, and the n-type doped regions 613 and 614 are respectively located beside both sides of the gate layer 642. Consequently, the gate layer 644, the n-type doped region 611, the n-type doped region 612 and the P-type well region PW1 are collaboratively formed as a switching transistor Me. The gate layer 640, the n-type doped region 612, the n-type doped region 613 and the P-type well region PW1 are collaboratively formed as a floating gate transistor M1. The gate layer 642, the n-type doped region 613, the n-type doped region 614 and the P-type well region PW1 are collaboratively formed as a select transistor Ma. Moreover, the gate layer 640 and the n-type doped region 622 are collaboratively formed as a capacitor C1. The structures of the memory cell c12, c21, c22 are similar to the memory cell c11, and thus detailed description thereof is omitted.

In the memory cell array 600 of this embodiment, the floating gate transistors M1~M4, the switching transistors Me~Mh and the select transistors Ma~Md of the four memory cells c11~c22 in different rows are all constructed in the P-well region PW1. Moreover, the P-well region PW1 is connected with the erase line EL1. In other words, the body terminals of the four floating gate transistors M1~M4, the four switching transistors Me~Mh and the four select transistors Ma~Md are all connected with the erase line EL1.

As shown in FIG. 6B, the memory cell array 600 comprises four memory cells c11~c22, which are arranged in a 2×2 array. Moreover, the memory cell array 600 is connected with the word lines WL1, WL2, the coupling lines CL1, CL2, the source lines SL1, SL2, the bit lines BL1, BL2, and the erase line EL1. The first row of the memory cell array 600 includes the two memory cells c11 and c12. The second row of the memory cell array 600 includes the two memory cells c21 and c22. Moreover, the memory cells of the memory cell array 600 in the same row are collaboratively formed as one page.

In the memory cell c11, the first drain/source terminal of the switching transistor Me is connected with the source line SL1, the gate terminal of the switching transistor Me is connected to the word line WL1, the first drain/source terminal of the floating gate transistor M1 is connected with the second drain/source terminal of the switching transistor Me, the second drain/source terminal of the floating gate transistor M1 is connected with the first drain/source terminal of the select transistor Ma, the second drain/source terminal of the select transistor Ma is connected with the bit line BL1, the gate terminal of the select transistor Ma is connected with the word line WL1, and the body terminals of the switching transistor Me, the floating gate transistor M1 and the select transistor Ma are connected with the erase line EL1. Moreover, the first terminal of the capacitor C1 is connected with the floating gate of the floating gate transistor M1, and the second terminal of the capacitor C1 is connected with the coupling line CL1. The detailed connection of the memory cell c12, c21, c22 are similar to the memory cell c11, and thus detailed description thereof is omitted.

Generally, by providing proper bias voltages to the word lines WL1, WL2, the coupling lines CL1, CL2, the source lines SL1, SL2, the bit lines BL1, BL2, the erase lines EL1, the P-type wells PW2, PW3 and the deep N-type well region (DNW) 605, program actions, erase actions or read actions can be performed on the memory cells c11~c22 of the memory cell array 600. The associated operations will be described as follows.

Figure 7A:
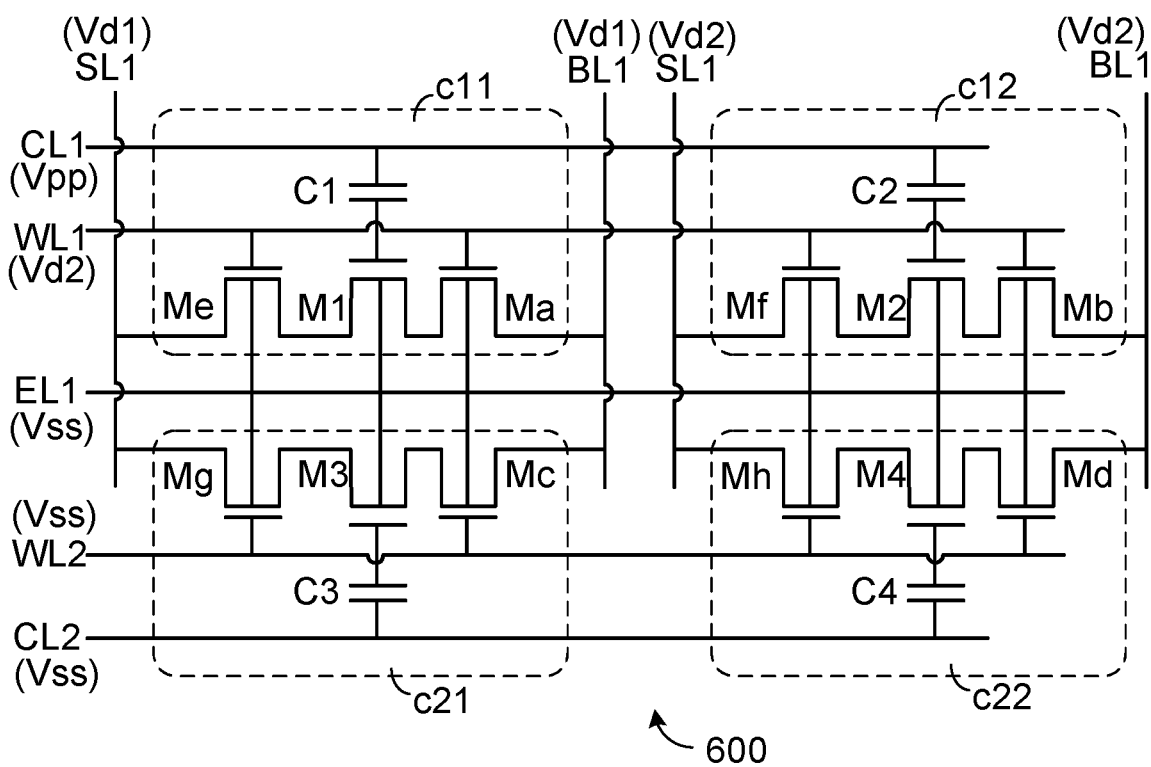
FIGS. 7A-7C schematically illustrate the bias voltages for performing various actions on the memory cell array of the second embodiment of the present invention.
Figure 7B:
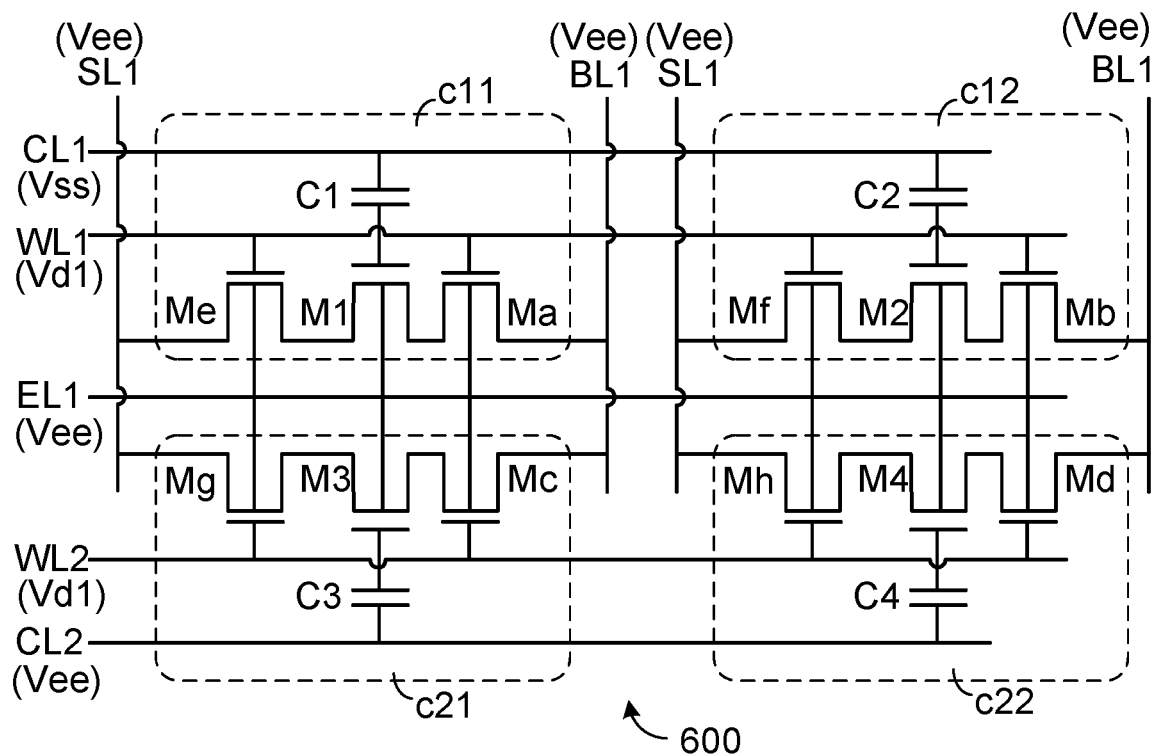
Figure 7C:
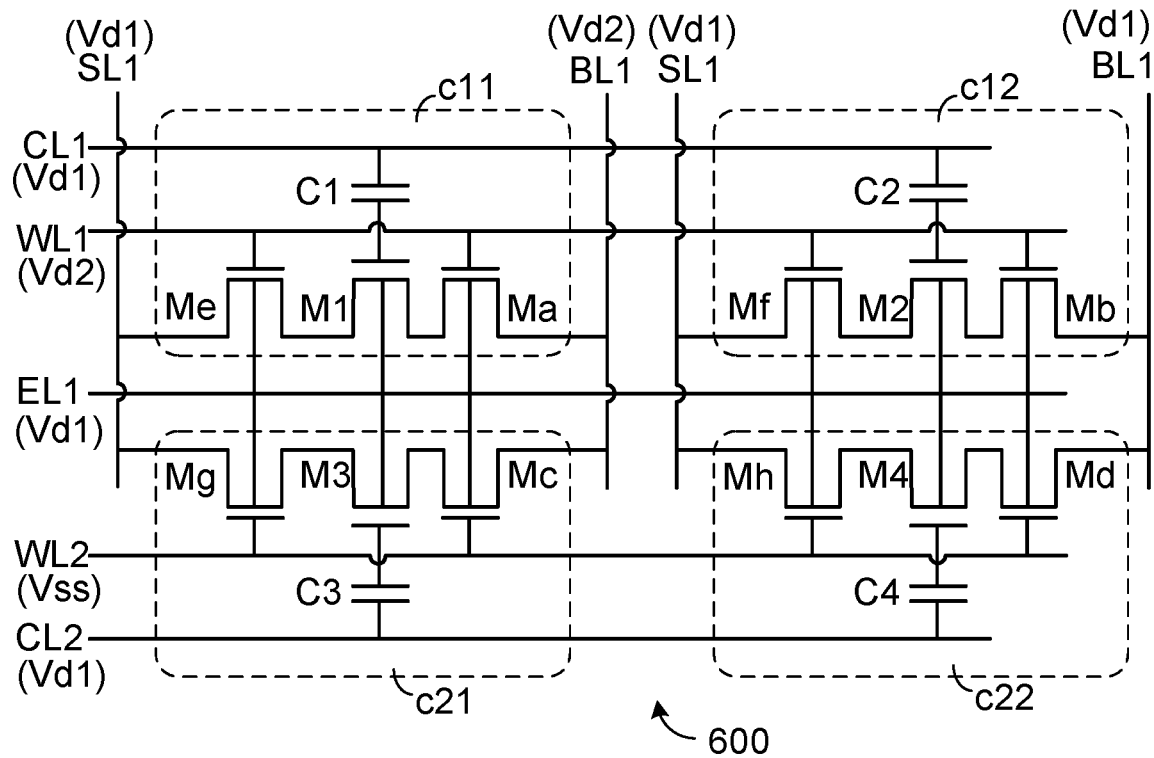

FIGS. 7A-7C schematically illustrate the bias voltages for performing various actions on the memory cell array of the third embodiment of the present invention. During the operation of the memory cell array 600, only one row is a selected row, and the other rows are unselected row.

Please refer to FIG. 7A. During the program action, the coupling line CL1 receives the program voltage (Vpp), the coupling line CL2 receives the lowest voltage (Vss), the word line WL1 receives the second supply voltage (Vd2), the word line WL2 receives the lowest voltage (Vss), the source line SL1 and the bit line BL1 receive the first supply voltage (Vd1), the source line SL2 and the bit line BL2 receives the second supply voltage (Vd2), and the erase line EL1 receives the lowest voltage (Vss). The voltage received by the P-type well region PW2 and the voltage received by the coupling line CL1 are equal, i.e., the program voltage (Vpp). The voltage received by the P-type well region PW3 and the voltage received by the coupling line CL2 are equal, i.e., the lowest voltage (Vss). The deep N-type well region (DNW) receives the program voltage (Vpp). The program voltage (Vpp) is higher than the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the program voltage (Vpp) is 8V, the second supply voltage (Vd2) is 5V, the first supply voltage (Vd1) is 1V, and the lowest voltage (Vss) is 0V.

During the program action, the coupling line CL1 receives the program voltage (Vpp) and the word line WL1 receives the second supply voltage (Vd2). Consequently, the row of the memory cell array 600 connected to the coupling line CL1 and the word line WL1 (i.e., the first row) is the selected row. Moreover, during the program action, the coupling line CL2 receives the lowest voltage (Vss) and the word line WL2 receives the lowest voltage (Vss). Consequently, the row of the memory cell array 600 connected to the coupling line CL2 and the word line WL2 (i.e., the second row) is the unselected row. The memory cells c21 and c22 in the unselected row cannot be programmed.

In the selected row, the source line SL1 and the bit line BL1 receive the first supply voltage (Vd1), and the word line WL1 receives the second supply voltage (Vd2). Consequently, the switching transistor Me and the select transistor Ma are turned on, and hot carriers (e.g., electrons) are injected into the floating gate of the floating gate transistor M1 of the memory cell c11 through a Fowler-Nordheim tunneling effect (i.e., a FN tunneling effect). Under this circumstance, the memory cell c11 is programmed to a first storage state. The source line SL2 and the bit line BL2 receive the second supply voltage (Vd2), and the word line WL1 receives the second supply voltage (Vd2). Consequently, the switching transistor Mf and the transistor Mb are turned off, and no hot carriers (e.g., electrons) are injected into the floating gate of the floating gate transistor M2 of the memory cell c12. Under this circumstance, the memory cell c12 is programmed to a second storage state. In other words, by properly controlling the voltages of the source lines SL1, SL2 and the bit lines BL1, BL2, the memory cells c11 and c12 in the selected row can be programmed to the first storage state or the second storage state.

Please refer to FIG. 7B. During the erase action, the coupling line CL1 receives the lowest voltage (Vss), the coupling line CL2 receives the erase voltage (Vee), the word line WL1 and the word line WL2 receive the first supply voltage (Vd1), the source lines SL1, SL2 and the bit lines BL1, BL2 receive the erase voltage (Vee), and the erase line EL1 receives the erase voltage. (Vee). The voltage received by the P-type well region PW2 and the voltage received by the coupling line CL1 are equal, i.e., the lowest voltage (Vss). The voltage received by the P-type well region PW3 and the voltage received by the coupling line CL2 are equal, i.e., the erase voltage (Vee). The deep N-type well region (DNW) receives the erase voltage (Vee). The erase voltage (Vee) is higher than the lowest voltage (Vss). The lowest voltage (Vss) is lower than or equal to 0V. For example, the erase voltage (Vee) is 12V, and the lowest voltage (Vss) is 0V.

During the erase action, the coupling line CL1 receives the lowest voltage (Vss), and the coupling line CL2 receives the erase voltage (Vee). Consequently, the row of the memory cell array 600 connected to the coupling line CL1 (i.e., the first row) is the selected row, and the row of the memory cell array 600 connected to the coupling line CL2 (i.e., the second row) is the unselected row. The memory cells c21 and c22 in the unselected row cannot be erased.

In the selected row, the erase line EL1, the source lines SL1, SL2 and the bit lines BL1, BL2 receive the erase voltage (Vee). Consequently, hot carriers (e.g., electrons) are ejected from the floating gates of the floating gate transistors M1, M2 of the memory cells c11 and c12 through a Fowler-Nordheim tunneling effect (i.e., a FN tunneling effect). Under this circumstance, the memory cells c11 and c12 are erased to the second storage state. In other words, during the erase action, all of the memory cells in the selected row (i.e., the memory cells in the selected page) are erased to the second storage state.

Please refer to FIG. 7C. During the read action, the coupling line CL1 receives the first supply voltage (Vd1), the coupling line CL2 receives the first supply voltage (Vd1), the word line WL1 receives the second supply voltage (Vd2), the word line WL2 receives the lowest voltage (Vss), the source line SL1 receives the first supply voltage (Vd1), the bit line BL1 receives the second supply voltage (Vd2), the source line SL2 and the bit line BL2 receive the first supply voltage (Vd1), and the erase line EL1 receives the first supply voltage (Vd1). The voltage received by the P-type well region PW2 and the voltage received by the coupling line CL1 are equal, i.e., the first supply voltage (Vd1). The voltage received by the P-type well region PW3 and the voltage received by the coupling line CL2 are equal, i.e., the first supply voltage (Vd1). The deep N-type well region (DNW) receives the second supply voltage (Vd2). The second supply voltage (Vd2) is higher than the first supply voltage (Vd1). The first supply voltage (Vd1) is higher than or equal to the lowest voltage (Vss). The lowest voltage (Vss) is lower than or equal to 0V. For example, the second supply voltage (Vd2) is 5V, the first supply voltage (Vd1) is 1V, and the lowest voltage (Vss) is 0V.

During the read action, the coupling line CL1 receives the first supply voltage (Vd1) and the word line WL1 receives the second supply voltage (Vd2). Consequently, the row of the memory cell array 600 connected to the coupling line CL1 (i.e., the first row) is the selected row. Moreover, during the read action, the coupling line CL2 receives the first supply voltage (Vd1) and the word line WL2 receives the lowest voltage (Vss). Consequently, the row of the memory cell array 600 connected to the coupling line CL2 (i.e., the second row) is the unselected row. The memory cells c21 and c22 in the unselected row cannot be read.

In the selected row, the word line WL1 receives the second supply voltage (Vd2), the source line SL1 receives the first supply voltage (Vd1), and the bit line BL1 receives the second supply voltage (Vd2). Consequently, the switching transistor Me and the select transistor Ma are turned on, and the memory cell c11 generates a read current. The read current flows from the bit line BL1 to the source line SL1 through the floating gate transistor M1. Moreover, the magnitude of the read current is determined according to the storage state of the memory cell c11. For example, the read current corresponding to the first storage state is lower than the read current corresponding to the second storage state. During the read action, the storage state of the memory cell c11 can be judged according to the magnitude of the read current generated by the memory cell c11.

Moreover, the word line WL1 receives the second supply voltage (Vd2), and the source line SL2 and the bit line BL2 receive the first supply voltage (Vd1). Consequently, the switching transistor Mf and the select transistor Mb are turned off, and the memory cell c12 does not generate a read current. In other words, by controlling ant memory cell of the selected row to generate the read current or not generate the read current, the storage state of the memory cell can be judged.

As mentioned above, the floating gate transistors, the switching transistors and the select transistors of the memory cells in different rows of the memory cell array 600 are constructed in the same P-type well region PW1. Consequently, the chip size can be largely reduced. Although the floating gate transistors of the memory cells in different rows are constructed in the same P-type well region PW1, only the stored data in the memory cells of the selected row (or the selected page) can be read during the read action. That is, the stored data in the memory cells of the unselected row (or the unselected page) cannot be read.

From the above descriptions, the present invention provides a memory cell array of a multi-time programmable non-volatile memory. The memory cell array comprises plural memory cells. In case that the memory cell comprises one floating gate transistor and one capacitor, the memory cell is referred as a 1T1C cell. In case that the memory cell comprises one floating gate transistor, one select gate transistor and one capacitor, the memory cell is referred as a 2T1C cell. In case that the memory cell comprises one floating gate transistor, one switching transistor, one select gate transistor and one capacitor, the memory cell is referred as a 3T1C cell. Moreover, the floating gate transistors of the memory cells in different rows of the memory cell array are constructed in the same well region. Consequently, the chip size is reduced. Moreover, by providing proper bias voltages to the memory cell array, the program action, the erase action or the read action can be performed normally.

Moreover, the memory cell of the memory cell array according to the above embodiments adopts a floating gate transistor as a storage device. In the alternative embodiments, the floating gate transistor can be replaced by a memory transistor having a charge storage layer. For example, the memory transistor is the transistor with ONO gate dielectric layer. The ONO gate dielectric layer includes Oxide/Nitride/Oxide film, and the nitride layer is the charge storage layer. It is to be noted that memory transistors having a charge storage layer of the memory cells in different rows of the memory cell array are constructed in the same well region, i.e. each body terminal of the memory transistors is connected with the same erase line. The structure and operation are similar to the memory cell of the previous three embodiment, and thus detailed description thereof is omitted.

In the above embodiments, the transistors are N-type transistors. It is noted that the types of the transistors are not restricted. For example, in another embodiment, the memory cell comprises at least one P-type transistor and a capacitor. The P-type transistors of different memory cells are constructed in the same N-type well region. By using the above manufacturing process, three isolated N-type well regions are formed in the P-type substrate. Then, gate layers are formed over the N-type regions. Then, plural P-type doped regions. Consequently, the memory cell array is produced. Moreover, by providing proper bias voltages to the memory cell array, the program action, the erase action or the read action can be performed normally.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell array of a multi-time programmable non-volatile memory, the memory cell array is connected with a first coupling line, a second coupling line, a first erase line, a first source line, a second source line, a first bit line and a second bit line, the memory cell array comprising:
   a first memory cell, wherein the first memory cell is connected with the first coupling line, the first erase line, the first source line and the first bit line;
   a second memory cell, wherein the second memory cell is connected with the first coupling line, the first erase line, the second source line and the second bit line;
   a third memory cell, wherein the third memory cell is connected with the second coupling line, the first erase line, the first source line and the first bit line; and
   a fourth memory cell, wherein the fourth memory cell is connected with the second coupling line, the first erase line, the second source line and the second bit line;
   wherein during a program action, the first coupling line receives a program voltage, and the second coupling line and the first erase line receive a lowest voltage, wherein the first source line and the first bit line receive a first supply voltage, so that the first memory cell is programmed to a first storage state, wherein the second source line and the second bit line receive a second supply voltage, so that the second memory cell is programmed to a second storage state, wherein the program voltage is higher than the second supply voltage, the second supply voltage is higher than the first supply voltage, the first supply voltage is higher than or equal to the lowest voltage.

2. The memory cell array as claimed in claim 1, wherein the first erase line is connected with a first well region, the first coupling line is connected with a second well region, the second coupling line is connected with a third well region.

3. The memory cell array as claimed in claim 1, wherein during an erase action, the first coupling line receives the lowest voltage, and the second coupling line and the first erase line receive an erase voltage, wherein the first source line and the first bit line receive the erase voltage, so that the first memory cell is erased to the second storage state, wherein the second source line and the second bit line receive the erase voltage, so that the second memory cell is erased to the second storage state, wherein the erase voltage is higher than the lowest voltage.

4. The memory cell array as claimed in claim 1, wherein during a read action, the first coupling line and the first erase line receive the first supply voltage, and the second coupling line receives the lowest voltage, wherein the first source line receives the first supply voltage, and the first bit line receives the second supply voltage, so that the first memory cell generates a read current, wherein the second source line and the second bit line receive the first supply voltage, so that the second memory cell does not generate the read current.

5. A memory cell array of a multi-time programmable non-volatile memory, the memory cell array is connected with a first word line, a second word line, a first coupling line, a second coupling line, a first erase line, a first source line, a second source line, a first bit line and a second bit line, comprising:
   a first memory cell, wherein the first memory cell is connected with the first word line, the first coupling line, the first erase line, the first source line and the first bit line;
   a second memory cell, wherein the second memory cell is connected with the first word line, the first coupling line, the first erase line, the second source line and the second bit line;
   a third memory cell, wherein the third memory cell is connected with the second word line, the second coupling line, the first erase line, the first source line and the first bit line; and
   a fourth memory cell, wherein the fourth memory cell is connected with the second word line, the second coupling line, the first erase line, the second source line and the second bit line;
   wherein during a program action, the first coupling line receives a program voltage, the second coupling line and the first erase line receive a lowest voltage, wherein the first source line and the first bit line receive a first supply voltage, the first word line receives a second supply voltage, so that the first memory cell is programmed to a first storage state, wherein the second source line and the second bit line receive the second supply voltage, the second word line receives the lowest voltage, so that the second memory cell is programmed to a second storage state, wherein the program voltage is higher than the second supply voltage, the second supply voltage is higher than the first supply voltage, the first supply voltage is higher than or equal to the lowest voltage.

6. The memory cell array as claimed in claim 5, wherein during an erase action, the first coupling line receives the lowest voltage, the second coupling line and the first erase line receive an erase voltage, and the first word line and the second word line receive the first supply voltage, wherein the first source line and the first bit line receive the erase voltage, so that the first memory cell is erased to the second storage state, wherein the second source line and the second bit line receive the erase voltage, so that the second memory cell is erased to the second storage state, wherein the erase voltage is higher than the lowest voltage.

7. The memory cell array as claimed in claim 5, wherein during a read action, the first coupling line, the second coupling line and the first erase line receive the first supply voltage, the first word line receives the second supply voltage, and the second word line receives the lowest voltage, wherein the first source line receives the first supply voltage, and the first bit line receives the second supply voltage, so that the first memory cell generates a read current, wherein the second source line and the second bit line receive the first supply voltage, so that the second memory cell does not generate the read current.

8. A memory cell array of a multi-time programmable non-volatile memory, the memory cell array is connected with a first coupling line, a second coupling line, a first erase line, a first source line, a second source line, a first bit line and a second bit line, the memory cell array comprising:

a first memory cell, wherein the first memory cell is connected with the first coupling line, the first erase line, the first source line and the first bit line, wherein the first memory cell comprises a first floating gate transistor and a first capacitor, wherein a first terminal of the first capacitor is connected with the first coupling line, and a second terminal of the first capacitor is connected with a floating gate of the first floating gate transistor;

a second memory cell, wherein the second memory cell is connected with the first coupling line, the first erase line, the second source line and the second bit line, wherein the second memory cell comprises ing a second floating gate transistor and a second capacitor, wherein a first terminal of the second capacitor is connected with the first coupling line, and a second terminal of the second capacitor is connected with a floating gate of the second floating gate transistor;

a third memory cell, wherein the third memory cell is connected with the second coupling line, the first erase line, the first source line and the first bit line, wherein the third memory cell comprises a third floating gate transistor and a third capacitor, wherein a first terminal of the third capacitor is connected with the second coupling line, and a second terminal of the third capacitor is connected to with floating gate of the third floating gate transistor; and a fourth memory cell, wherein the fourth memory cell is connected with the second coupling line, the first erase line, the second source line and the second bit line, wherein the fourth memory cell comprises a fourth floating gate transistor and a fourth capacitor, wherein a first terminal of the fourth capacitor is connected with the second coupling line, and a second terminal of the fourth capacitor is connected with a floating gate of the fourth floating gate transistor, wherein a body terminal of the first floating gate transistor, a body terminal of the second floating gate transistor, a body terminal of the third floating gate transistor and a body terminal of the fourth floating gate transistor are connected with the first erase line.

9. The memory cell array as claimed in claim 8, wherein the first memory cell, the second memory cell, the third memory cell and the fourth memory cell adopts memory transistors, each memory transistor of the memory cells includes a charge storage layer, and each body terminal of the memory transistors is connected with the first erase line.

* * * * *